(12) United States Patent
Kim et al.

(10) Patent No.: US 9,887,256 B2
(45) Date of Patent: Feb. 6, 2018

(54) DISPLAY DEVICE

(71) Applicant: SAMSUNG DISPLAY CO., LTD., Yongin-si, Gyeonggi-Do (KR)

(72) Inventors: Kwangmin Kim, Yongin-si (KR); Wonkyu Kwak, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/249,561

(22) Filed: Aug. 29, 2016

(65) Prior Publication Data

US 2017/0288002 A1    Oct. 5, 2017

(30) Foreign Application Priority Data

Mar. 31, 2016    (KR) .................. 10-2016-0039333

(51) Int. Cl.
*H01L 27/32* (2006.01)
*H01L 51/00* (2006.01)

(52) U.S. Cl.
CPC ........ *H01L 27/3276* (2013.01); *H01L 27/326* (2013.01); *H01L 51/0097* (2013.01)

(58) Field of Classification Search
CPC ............. H01L 27/3276; H01L 51/0097; H01L 27/326; G09G 3/3659; G09G 3/3674
See application file for complete search history.

(56) References Cited

U.S. PATENT DOCUMENTS

| | | | |
|---|---|---|---|
| 7,096,449 B1 * | 8/2006 | Teig .................... | G06F 17/5077 716/129 |
| 7,174,529 B1 * | 2/2007 | Hetzel ................. | G06F 17/5077 716/129 |
| 8,045,074 B2 * | 10/2011 | Tanahara .......... | G02F 1/136213 349/141 |
| 8,094,106 B2 * | 1/2012 | Huang ................. | G09G 3/2092 345/55 |
| 8,248,559 B2 * | 8/2012 | Morita .............. | G02F 1/133512 349/110 |
| 8,344,616 B2 * | 1/2013 | Sim ...................... | G09G 3/3225 313/505 |
| 8,405,809 B2 * | 3/2013 | Lee ....................... | G02F 1/1345 349/138 |
| 9,190,005 B2 * | 11/2015 | Watsuda .............. | G09G 3/3648 |
| 9,349,322 B2 * | 5/2016 | Kim ...................... | G09G 3/3258 |
| 9,626,900 B2 * | 4/2017 | Anzai .................. | G09G 3/3266 |

(Continued)

OTHER PUBLICATIONS

Extended European Search Report Dated Sep. 13, 2017 for Application No. 16202525.8.

*Primary Examiner* — William Coleman
(74) *Attorney, Agent, or Firm* — F. Chau & Associates, LLC

(57) ABSTRACT

A display device includes a display portion defining a display area and including a plurality of pixels, a scan driver disposed in a non-display area that is outside of the display area, and a plurality of scan connection lines. Each of the pixels is connected to a scan line from among a plurality of scan lines and a data line from among a plurality of data lines. The scan connection lines connect the scan driver to the scan lines. Each of the scan connection lines is connected to one of the scan lines through a contact hole disposed in at least one insulating layer, which is disposed between the scan lines and the scan connection lines in a cross-sectional view.

43 Claims, 19 Drawing Sheets

(56) References Cited

U.S. PATENT DOCUMENTS

| | | |
|---|---|---|
| 2008/0012812 A1 | 1/2008 | Kawata |
| 2009/0128017 A1 | 5/2009 | Sagawa et al. |
| 2010/0225621 A1 | 9/2010 | Jung et al. |
| 2012/0327064 A1 | 12/2012 | Qi et al. |
| 2014/0253419 A1* | 9/2014 | Tanada ................. G09G 3/2092 345/55 |
| 2016/0027380 A1 | 1/2016 | Kim et al. |
| 2016/0351098 A1* | 12/2016 | Lin .......................... G09G 3/20 |
| 2016/0351107 A1* | 12/2016 | Chen ....................... G09G 3/20 |

* cited by examiner

DISPLAY DEVICE

CROSS-REFERENCE TO RELATED APPLICATIONS

This application claims the benefit of Korean Patent Application No. 10-2016-0039333, filed on Mar. 31, 2016, the disclosure of which is incorporated by reference herein in its entirety.

TECHNICAL FIELD

Exemplary embodiments of the present inventive concept relate to a display device.

DISCUSSION OF THE RELATED ART

As the uses of display devices expand, the demand for display devices that have a slim profile and that are lightweight has increased.

As display devices are utilized in increasingly various manners, when designing the shape of a display device, the demand for increasing a ratio of a display area of the display device in which an image is provided, and relatively reducing a non-display area of the display device in which an image is not provided, has increased.

SUMMARY

According to an exemplary embodiment of the inventive concept, a display device includes a display portion defining a display area and including a plurality of pixels. Each of the pixels is connected to a scan line from among a plurality of scan lines and a data line from among a plurality of data lines. The display device further includes a scan driver disposed in a non-display area, which is outside of the display area. The display device further includes a plurality of scan connection lines connecting the scan driver to the scan lines. Each of the scan connection lines is connected to one of the scan lines through a first contact hole disposed in at least one insulating layer. The at least one insulating layer is disposed between the scan lines and the scan connection lines in a cross-sectional view.

Each of the plurality of pixels may include a pixel circuit including a thin film transistor and a storage capacitor, and a pixel electrode connected to the pixel circuit.

Each of the plurality of scan connection lines and the pixel electrodes may include a same material.

Each of the plurality of scan connection lines may be connected to a signal output terminal of the scan driver through a second contact hole disposed in at least one of the at least one insulating layer and an additional insulating layer. At least one of the at least one insulating layer and the additional insulating layer is disposed between the signal output terminal and the scan connection lines in a cross-sectional view.

Each of the plurality of scan connection lines may integrally extend from the scan driver to one of the scan lines.

The display device may further include a data driver disposed in the non-display area, and a driving voltage supply line disposed in the non-display area. At least a portion of the driving voltage supply line may be located between the scan driver and the display portion. The display device may further include a plurality of data connection lines disposed in the non-display area and connecting the data driver to the data lines. At least one of the data connection lines overlaps the portion of the driving voltage supply line in a region between the scan driver and the display portion.

A central portion of at least one of the scan connection lines disposed between two ends of the at least one of the scan connection lines may cross the scan driver, the scan line, the driving voltage supply line, and at least one of the data connection lines.

At least one of the plurality of scan connection lines may overlap the driving voltage supply line and at least one of the data connection lines between the scan driver and the display portion.

Each of the plurality of data connection lines may be connected to one of the data lines through a second contact hole disposed in at least one of the at least one insulating layer and an additional insulating layer. At least one of the at least one insulating layer and the additional insulating layer may be disposed between the data lines and the data connection lines in a cross-sectional view.

The data connection lines may be alternately disposed above and below the at least one insulating layer or an additional insulating layer.

Neighboring data connection lines from among the plurality of data connection lines may not overlap each other.

The plurality of data connection lines may include a same metallic element.

The driving voltage supply line and the data lines may include a same material.

The driving voltage supply line, the plurality of data connection lines, and the plurality of scan connection lines may include different materials.

The display device may further include a first insulating layer disposed between the driving voltage supply line and the plurality of data connection lines in a cross-sectional view. The driving voltage supply line may be disposed above the first insulating layer, and the plurality of data connection lines may be disposed below the first insulating layer.

The display device may further include a second insulating layer disposed above the driving voltage supply line. The plurality of scan connection lines may be disposed above the second insulating layer.

The display device may further include a second insulating layer disposed below the driving voltage supply line. The plurality of scan connection lines may be disposed below the second insulating layer.

The display portion may have a polygonal shape, a circular shape, or an elliptical shape.

At least two of the pixels may be adjacent to an outer edge of the display portion and arranged in a stepwise configuration.

At least two of the pixels may be arranged in a corner region of the display portion.

At least a portion of the scan driver may be curved.

The display device may further include a flexible substrate, which includes the display portion.

Each of the plurality of pixels may include an organic light-emitting diode (OLED).

According to an exemplary embodiment of the inventive concept, a display device includes a substrate, and a display portion disposed above the substrate and including a plurality of pixels. Each of the pixels is connected to a scan line from among a plurality of scan lines and a data line from among a plurality of data lines. At least two of the pixels are adjacent to an outer edge of the display portion and arranged in a stepwise configuration. The display device further includes a scan driver disposed above the substrate and configured to transmit a scan signal via a plurality of scan connection lines connected to the scan lines. Each of the scan connection lines is connected to one of the scan lines through a first contact hole. The display device further includes a data driver disposed above the substrate, and a driving voltage supply line. At least a portion of the driving voltage supply line is adjacent to the at least two of the pixels. The display device further includes a plurality of data connection lines configured to connect the data driver to the data lines. At least one of the data connection lines overlaps the portion of the driving voltage supply line in a region adjacent to the at least two of the pixels.

Each of the plurality of data connection lines may be connected to one of the data lines through a second contact hole disposed in at least one insulating layer, which is disposed between the data lines and the data connection lines in a cross-sectional view.

The data connection lines may be alternately disposed above and below an insulating layer.

Neighboring data connection lines from among the plurality of data connection lines may not overlap each other.

The driving voltage supply line may be bent in a stepwise configuration along the at least two of the pixels.

The scan driver may be disposed outside the display portion, and at least a portion of the driving voltage supply line may be located between the scan driver and the display portion.

At least one scan connection line from among the plurality of scan connection lines may overlap the driving voltage supply line.

Each of the plurality of scan connection lines may integrally extend from the scan driver to one of the scan lines.

Each of the first contact holes may be located at an end of one of the scan connection lines.

The plurality of scan connection lines and pixel electrodes of the plurality of pixels may include a same material.

The driving voltage supply line and the data lines may include a same material.

Each of the plurality of pixels may include a thin film transistor and a storage capacitor, and the data connection lines may include a same material as one of gate electrodes of the thin film transistors and electrodes of the storage capacitors.

Each of the plurality of pixels may include an organic light-emitting diode (OLED).

The substrate may be flexible.

The display portion may have a polygonal shape, a circular shape, or an elliptical shape.

According to an exemplary embodiment of the inventive concept, a display device includes a display portion defining a display area and including a plurality of pixels. Each of the pixels is connected to a scan line from among a plurality of scan lines and a data line from among a plurality of data lines. The display device further includes a scan driver disposed in a non-display area, which is disposed outside of the display area, and a plurality of scan connection lines connecting the scan driver to the scan lines. Each scan connection line is connected to one signal output terminal from among a plurality of signal output terminals of the scan driver through a first contact hole disposed at a first end of the scan connection line, and is connected to one scan line from among the plurality of scan lines via a second contact hole disposed at a second end of the scan connection line.

Each scan connection line may be a continuous line having no breaks between the first contact hole and the second contact hole.

The first contact hole may be disposed in at least one insulating layer, and the at least one insulating layer may be disposed between the scan lines and the scan connection lines in a cross-sectional view.

The second contact hole may be disposed in at least one insulating layer, and the at least one insulating layer may be disposed between the signal output terminals and the scan connection lines in a cross-sectional view.

At least two of the pixels may be arranged in a stepwise configuration in a corner region of the display portion.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION

Figure 1:
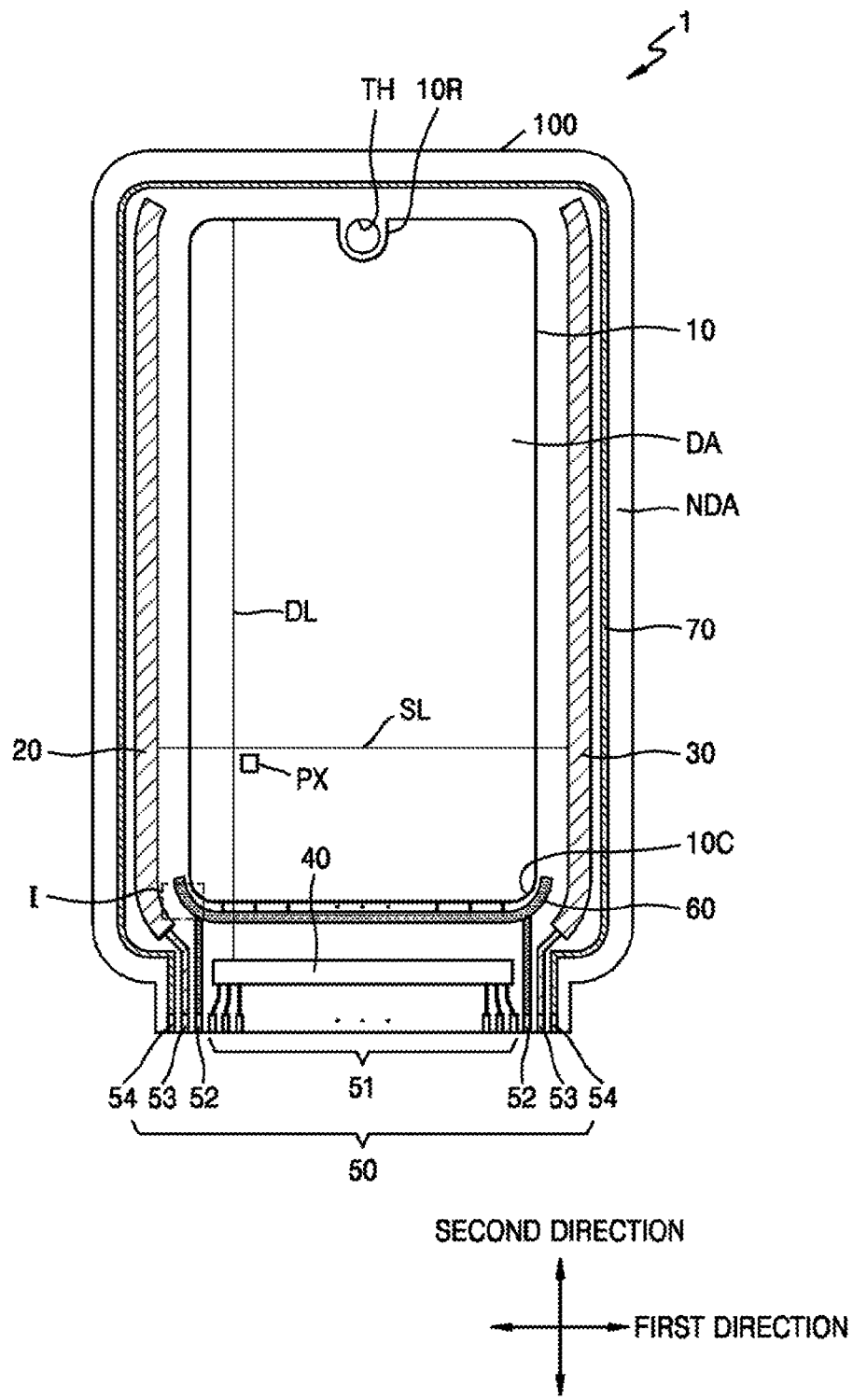
FIG. 1 is a plan view illustrating a display device according to an exemplary embodiment of the inventive concept.

Exemplary embodiments of the inventive concept will be described more fully hereinafter with reference to the accompanying drawings. In the drawings, like reference numerals may denote like or corresponding elements, and a repeated description thereof may be omitted.

It will be understood that although the terms "first", "second", etc. may be used herein to distinguish one element from another, the elements are not limited by these terms. Thus, a "first" element in an exemplary embodiment may be described as a "second" element in another exemplary embodiment.

As used herein, the singular forms "a" "an" and "the" are intended to include the plural forms as well, unless the context clearly indicates otherwise.

When a certain exemplary embodiment may be implemented differently, a specific process order may be performed differently from the described order. For example, two consecutively described processes may be performed substantially at the same time or performed in an order opposite to the described order.

It will be understood that when a layer, region, or component is referred to as being "on", "connected to", "coupled to", or "adjacent to" another layer, region, or component, it may be directly on, connected, coupled, or adjacent to the other layer, region, or component, or an intervening layer(s), region(s), or component(s) may also be present. For example, it will be understood that when a layer, region, or component is referred to as being "electrically connected" to another layer, region, or component, it may be "directly electrically connected" to the other layer, region, or component, or may be "indirectly electrically connected" to the other layer, region, or component with another layer(s), region(s), or component(s) interposed therebetween. It will also be understood that when a layer, region, or component is referred to as being "between" two layers, regions, or components, it can be the only layer, region, or component between the two layers, regions, or components, or another layer(s), region(s), or component(s) may also be present between the two layers, regions, or components. Further, when a first layer, region, or component is described as surrounding a second layer, region, or component, it is to be understood that the first layer, region, or component may entirely or partially surround the second layer, region, or component, unless the context, including the drawings, indicates otherwise.

Spatially relative terms, such as "beneath", "below", "lower", "under", "above", "upper", etc., may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" or "under" other elements or features would then be oriented "above" the other elements or features. Thus, the exemplary terms "below" and "under" can encompass both an orientation of above and below.

Herein, when processes or events are described as being performed at or occurring at substantially the same time, it is to be understood that the processes or events may be performed at or may occur at exactly the same time, or at about the same time as would be understood by a person having ordinary skill in the art.

Exemplary embodiments of the inventive concept provide a display device that reduces an area occupied by a non-display area.

FIG. 1 is a plan view illustrating a display device 1 according to an exemplary embodiment of the inventive concept.

Referring to FIG. 1, the display device 1 includes a display portion 10 disposed above a substrate 100, first and second scan drivers 20 and 30, a data driver 40, a terminal unit 50 (e.g., a terminal circuit 50), a driving voltage supply line 60, and a common voltage supply line 70.

The substrate 100 may include a material such as, for example, glass including $SiO_2$, metal, or an organic material. According to an exemplary embodiment, the substrate 100 may include a flexible material. For example, the substrate 100 may include a flexible plastic material such as polyimide. However, exemplary embodiments of the inventive concept are not limited thereto. According to an exemplary embodiment, the plastic material may include polyethersulphone (PES), polyacrylate (PAR), polyether imide (PEI), polyethyelenen naphthalate (PEN), polyethyeleneterephtalate (PET), polyphenylene sulfide (PPS), polyallylate, polyimide, PC, TAC, cellulose acetate propionate (CAP), cyclic olefin polymer, cyclic olefin copolymer, etc.

The display portion 10 includes pixels PX connected to a scan line SL extending in a first direction and a data line DL extending in a second direction crossing the first direction. Each pixel PX may emit red, green, blue, or white light, and may include an organic light-emitting diode (OLED). The display portion 10 provides a predetermined image by using light emitted from pixels PX. A display area DA is defined by the pixels PX. A non-display area NDA is an area in which the pixels PX are not disposed. An image is not provided in the non-display area NDA.

The first and second scan drivers 20 and 30 are disposed above the substrate 100. For example, the first and second scan drivers 20 and 30 are disposed in the non-display-area NDA of the substrate 100. The first and second scan drivers 20 and 30 generate a scan signal, and transmit the scan signal to each pixel PX via the scan line SL. For example, the first scan driver 20 may be disposed to the left of the display portion 10, and the second scan driver 30 may be disposed to the right of the display portion 10.

The data driver 40 is disposed above the substrate 100. For example, the data driver 40 is disposed in the non-display area NDA of the substrate 100. The data driver 40 generates a data signal, and transmits the data signal to each pixel PX via the data line DL. The data driver 40 may be disposed on one side of the display portion 10. For example, the data driver 40 may be disposed below the display portion 10 where the terminal unit 50 is disposed.

The terminal unit 50 is disposed at one end of the substrate 100 and includes a plurality of terminals 51, 52, 53, and 54. In exemplary embodiments, the terminal unit 50 is not covered with an insulating layer, and is exposed and electrically connected to a controller such as a flexible printed circuit board or an integrated circuit (IC) chip. The controller converts a plurality of image signals received from outside into a plurality of image data signals, and transmits the image data signals to the data driver 40 via the terminal 51. Further, the controller may receive a vertical synchronization signal, a horizontal synchronization signal, and a clock signal, may generate control signals for controlling the driving of the first and second scan drivers 20 and 30 and the data driver 40, and may transmit the control signals to corresponding drivers via the terminals 51 and 53. The controller transmits a driving voltage ELVDD and a common voltage ELVSS to the driving voltage supply line 60 and the common voltage supply line 70 via the terminals 52 and 54, respectively.

The driving voltage supply line 60 is disposed in the non-display area NDA. For example, the driving voltage supply line 60 may be disposed between the data driver 40 and the display portion 10. At least a portion of the driving voltage supply line 60 is located between the first and second scan drivers 20 and 30 and the display portion 10. The driving voltage supply line 60 provides the driving voltage ELVDD to the pixels PX. At least a portion of the driving voltage supply line 60 is adjacent to at least two pixels PX that are adjacent to an outer edge of the display portion 10 and that arranged in a stepwise configuration.

The common voltage supply line 70 is disposed in the non-display area NDA and provides the common voltage ELVSS to an opposite electrode 223 (See FIG. 3A) of an organic light-emitting diode (OLED) of a pixel PX. For example, the common voltage supply line 70 may have a loop shape in which one side is open, and may extend along the edge of the substrate 100 in an area excluding the terminal unit 50.

One side of the display portion 10 may include a concave portion 10R partially surrounding a through portion TH. For example, the through portion TH is a hole passing through the display device 1. A camera, a sensor, a speaker, a microphone, etc. may be mounted in the through portion TH. Alternatively, the through portion TH may be a space for a separate member for the function of the display device 1 or a separate member that may add a new function of the display device 1.

In exemplary embodiments, the display portion 10 has an approximately quadrangular shape and includes a rounded corner region 10C. The ends of the first and second scan drivers 20 and 30 may be curved along the corner region 10C of the display portion 10. Both ends of the driving voltage supply line 60 extend into a space between the scan drivers 20 and 30 and the display portion 10 along the outer edge of the display portion 10, and provide a driving voltage ELVDD to a pixel PX disposed at the corner portion 10C from among pixels PX adjacent to the outer edge of the display portion 10. Although FIG. 1 illustrates a display device 1 including two scan drivers (e.g., the first and second scan drivers 20 and 30), exemplary embodiments of the inventive concept are not limited thereto. For example, in exemplary embodiments, the display device 1 may include one scan driver (e.g., the first scan driver 20 or the second scan driver 30).

Figure 2:
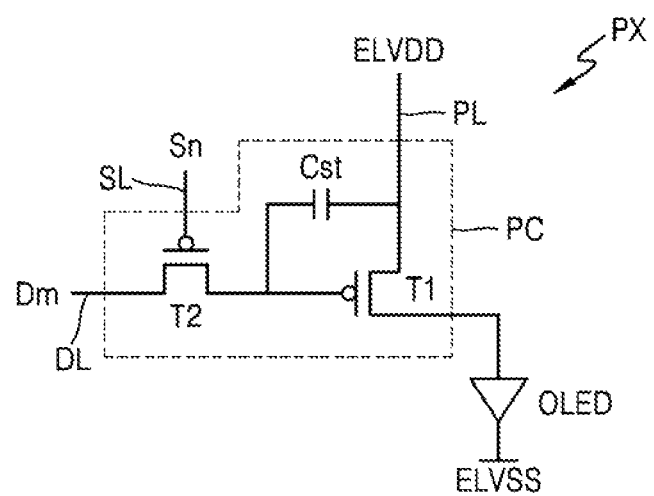
FIG. 2 is an equivalent circuit view illustrating a pixel according to an exemplary embodiment of the inventive concept.
Figure 3A:
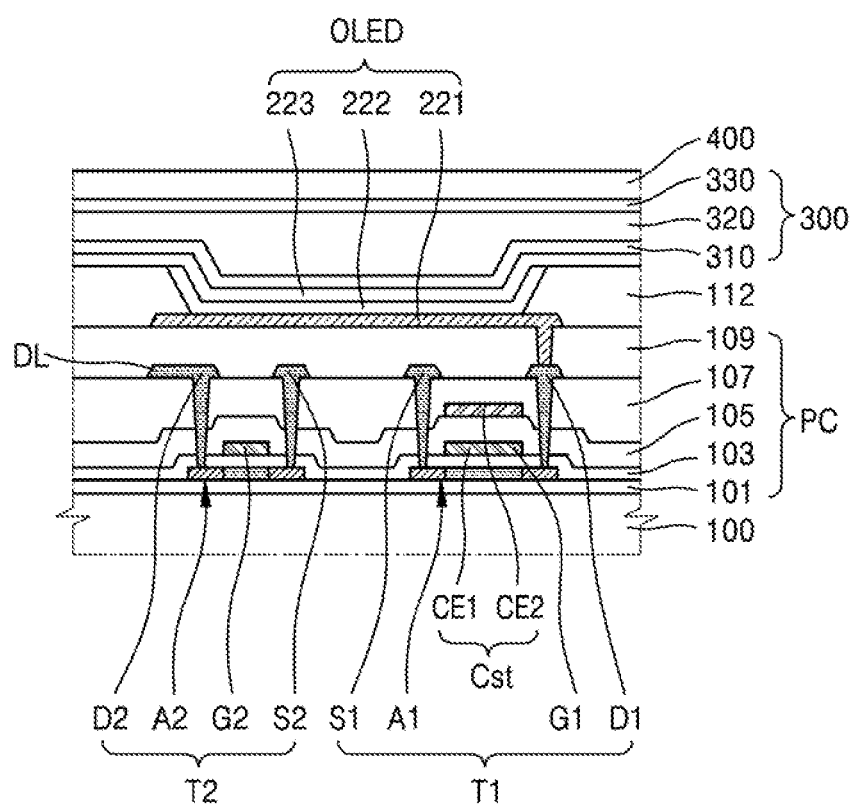
FIGS. 3A and 3B are cross-sectional views illustrating a pixel according to exemplary embodiments of the inventive concept.
Figure 3B:
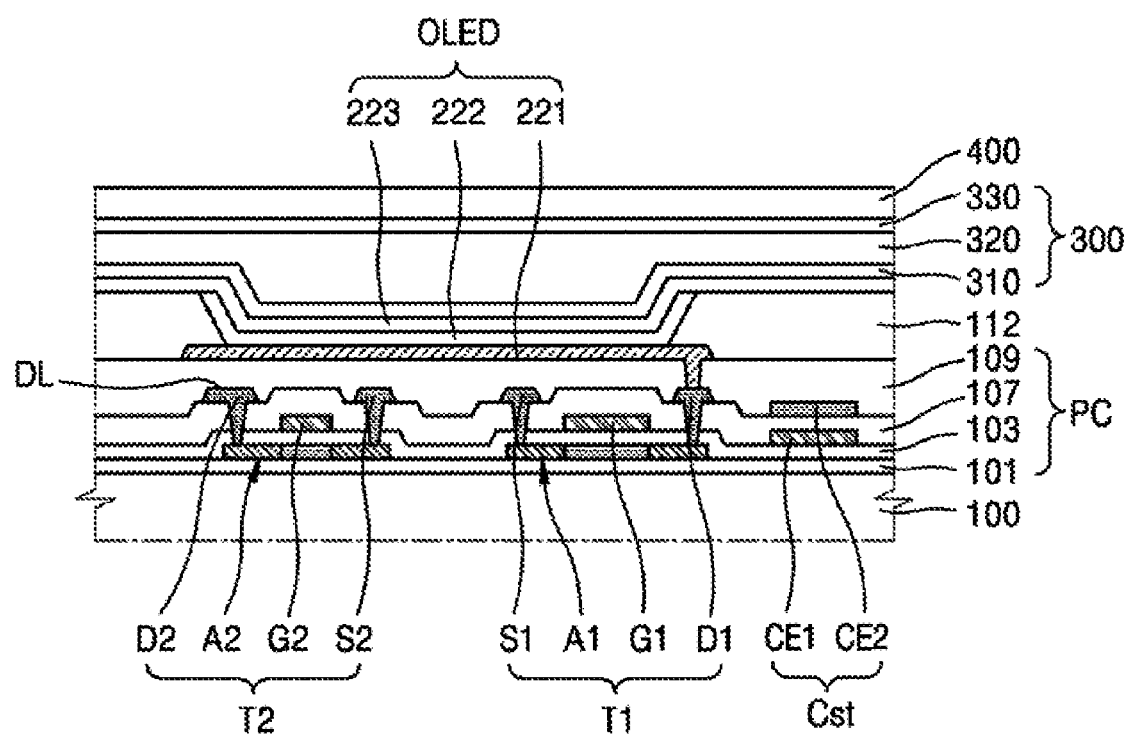
Figure 4:
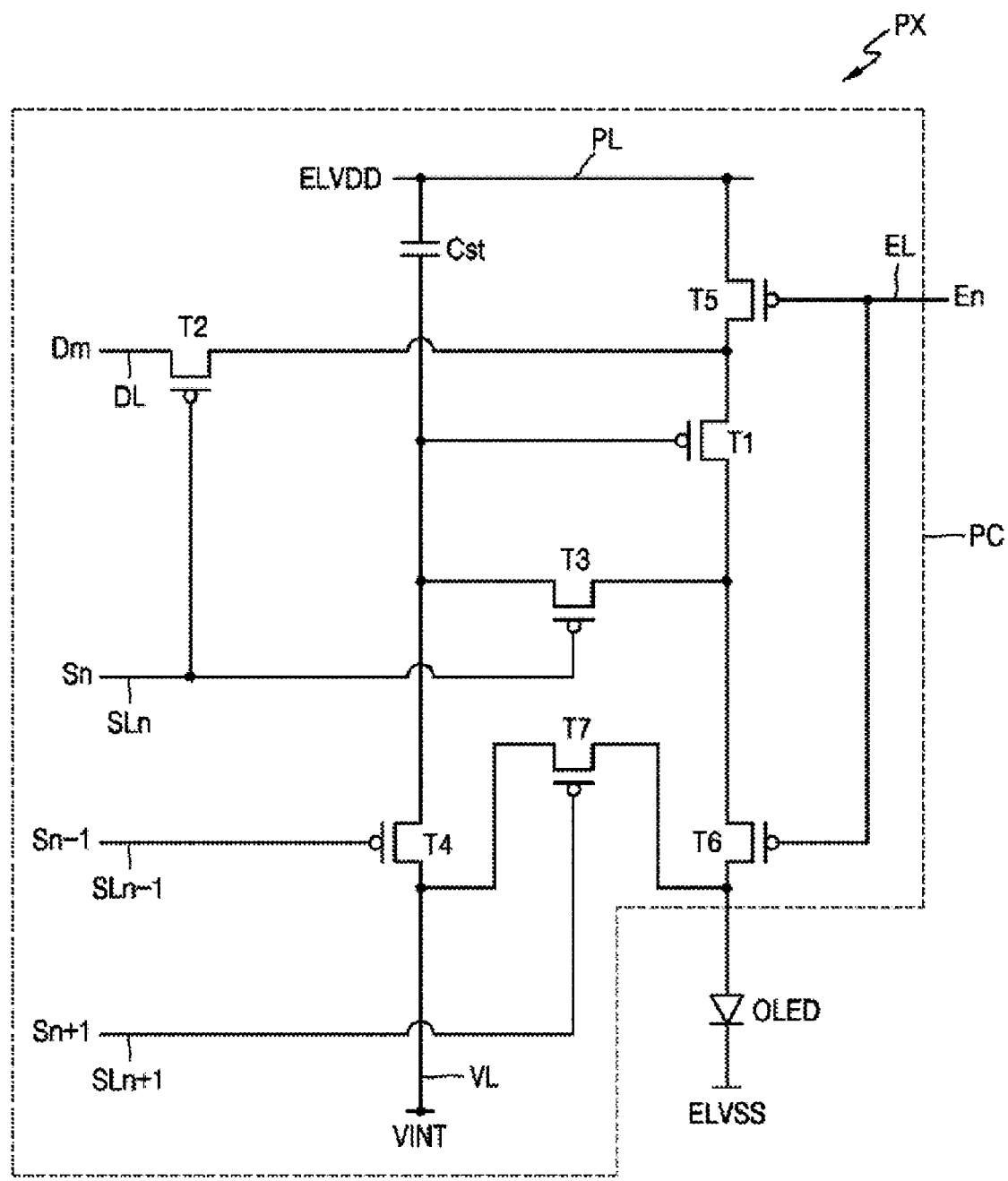
FIG. 4 is an equivalent circuit view illustrating a pixel according to an exemplary embodiment of the inventive concept.

FIG. 2 is an equivalent circuit view illustrating a pixel according to an exemplary embodiment of the inventive concept. FIGS. 3A and 3B are cross-sectional views illustrating a pixel according to exemplary embodiments of the inventive concept. FIG. 4 is an equivalent circuit view illustrating a pixel according to an exemplary embodiment of the inventive concept.

Referring to FIG. 2, each pixel PX includes a pixel circuit PC connected to a scan line SL and a data line DL, and a light-emitting device connected to the pixel circuit PC. The light-emitting device may be, for example, an organic light-emitting diode (OLED).

The pixel circuit PC includes a driving thin film transistor (TFT) T1, a switching TFT T2, and a storage capacitor Cst. The switching TFT T2 is connected to the scan line SL and the data line DL, and transmits a data signal Dm input via the data line DL to the driving TFT T1 in response to a scan signal Sn input via the scan line SL.

The storage capacitor Cst is connected to the switching TFT T2 and a driving voltage line PL, and stores a voltage corresponding to a difference between a voltage received from the switching TFT T2 and the driving voltage ELVDD supplied to the driving voltage line PL.

The driving TFT T1 is connected to the driving voltage line PL and the storage capacitor Cst, and may control a driving current flowing through an OLED from the driving voltage line PL in response to a voltage value stored in the storage capacitor Cst. The OLED may emit light having predetermined brightness by using the driving current.

Referring to FIG. 3A, a pixel PX includes a pixel circuit PC formed above the substrate 100 and an OLED connected to the pixel circuit PC. For convenience of explanation, a description of the pixel PX of FIG. 3A is made according to a stacking sequence.

A buffer layer 101 may be disposed above the substrate 100. The buffer layer 101 may reduce or block penetration of, for example, foreign substance, moisture, or external air from below the substrate 100, and may provide a planarization surface above the substrate 100. The buffer layer 101 may include an inorganic material such as, for example, an oxide layer (e.g., SiOx), a nitride layer (e.g., SiNx), an organic material, or an organic-inorganic composite material. The buffer layer 101 may include a single-layered or multi-layered structure of an inorganic material and an organic material.

The first TFT T1 includes a semiconductor layer A1, a gate electrode G1, a source electrode S1, and a drain electrode D1. The second TFT T2 includes a semiconductor layer A2, a gate electrode G2, a source electrode S2, and a drain electrode D2.

In exemplary embodiments, the semiconductor layers A1 and A2 may include, for example, amorphous silicon or polycrystalline silicon. In exemplary embodiments, the semiconductor layers A1 and A2 may include, for example, an oxide of at least one of In, Ga, Sn, Zr, V, Hf, Cd, Ge, Cr, Ti, and Zn. The semiconductor layers A1 and A2 may include a channel region, and a source region and a drain region doped with impurities.

The gate electrodes G1 and G2 are disposed above the semiconductor layers A1 and A2 with a gate insulating layer 103 disposed therebetween. The gate electrodes G1 and G2 may include, for example, Mo, Al, Cu, Ti, etc. The gate electrodes G1 and G2 may include a single layer or a multi-layer. For example, the gate electrodes G1 and G2 may be a single layer of Mo.

The gate insulating layer 103 may include, for example, SiOx, SiNx, SiON, $Al_2O_3$, $TiO_2$, $Ta_2O_5$, $Hf_2$, $ZnO_2$, etc.

The source electrodes S1 and S2 and the drain electrodes D1 and D2 are disposed above an interlayer insulating layer 107. The source electrodes S1 and S2 and the drain electrodes D1 and D2 may include a conductive material including, for example, Mo, Al, Cu, Ti, etc., and may include a single layer or a multi-layer including the above material. For example, the source electrodes S1 and S2 and the drain electrodes D1 and D2 may include a multi-structure of Ti/Al/Ti.

The interlayer insulating layer 107 may include, for example, SiOx, SiNx, SiON, $Al_2O_3$, $TiO_2$, $Ta_2O_5$, $Hf_2$, $ZnO_2$, etc.

A first electrode CE1 of the storage capacitor Cst may overlap the first TFT T1. For example, the gate electrode G1 of the first TFT T1 may perform a function of the first electrode CE1 of the storage capacitor Cst.

A second electrode CE2 of the storage capacitor Cst overlaps the first electrode CE1 with a dielectric layer 105 disposed therebetween. The second electrode CE2 may include a conductive material including, for example, Mo, Al, Cu, Ti, etc. The second electrode CE2 may include a single layer or a multi-layer including, for example, Mo, Al, Cu, Ti, etc. For example, the second electrode CE2 may be a single layer of Mo or a multi-layer of Mo/Al/Mo.

The dielectric layer 105 may include an inorganic material including an oxide or a nitride. For example, the dielectric layer 105 may include SiOx, SiNx, SiON, $Al_2O_3$, $TiO_2$, $Ta_2O_5$, $HfO_2$, $ZnO_2$, etc.

A planarization layer 109 may be disposed above the source electrodes S1 and S2 and the drain electrodes D1 and D2. An OLED may be disposed above the planarization layer 109. The planarization layer 109 may include a single layer or a multi-layer including an organic material. The organic material may include a general purpose polymer such as, for example, polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof. Further, the planarization layer 109 may include a composite stacked layer of an inorganic insulating layer and an organic insulating layer.

The OLED includes a pixel electrode 221, an emission layer 222, and an opposite electrode 223.

The pixel electrode 221 may be a reflective electrode. For example, the pixel electrode 221 may include a reflective layer including, for example, Ag, Mg, Al, Pt, Pd, Au, Ni, Nd, Ir, Cr, and a compound thereof, and a transparent or semi-transparent electrode layer formed above the reflective layer. The transparent or semi-transparent electrode may include at least one of, for example, an indium tin oxide (ITO), an indium zinc oxide (IZO), a zinc oxide (ZnO), $In_2O_3$, an indium gallium oxide (IGO), and an aluminum zinc oxide (AZO).

A pixel-defining layer 112, which is an insulating material, is disposed above the pixel electrode 221. The pixel-defining layer 112 may include at least one organic insulating material including, for example, polyimide, polyamide, an acryl resin, benzocyclobutene (BCB), and a phenol resin. The pixel-defining layer 112 may be formed using, for example, a spin coating method, etc. The pixel-defining layer 112 exposes the pixel electrode 221, and the emission layer 222 is disposed above the exposed region.

The emission layer 222 may include an organic material including fluorescent or phosphorescent material emitting red, green, blue, or white light. The emission layer 222 may include a low molecular organic material or a polymer organic material. A functional layer such as, for example, a hole transport layer (HTL), a hole injection layer (HIL), an electron transport layer (ETL), and an electron injection layer (EIL) may be selectively further disposed below and above the emission layer 222.

The opposite electrode 223 may be a transparent electrode. For example, the opposite electrode 223 may be a transparent or semi-transparent electrode and may include a metallic thin film having a small work function and including, for example, Li, Ca, LiF/Ca, LiF/Al, Al, Ag, Mg, and a compound thereof. Further, a transparent conductive oxide (TCO) layer including ITO, IZO, ZnO, or $In_2O_3$ may be further disposed above the metallic thin film.

A thin film encapsulation layer 300 prevents penetration of, for example, external moisture and oxygen. The thin film encapsulation layer 300 may include at least one organic layer 320 and one or more inorganic layers 310 and 330. The at least one organic layer 320 and the one or more inorganic layers 310 and 330 may be stacked alternately. Although FIG. 3A illustrates an example in which the thin film encapsulation layer 300 includes two inorganic layers 310 and 330 disposed below and above one organic layer 320, respectively, a stacking sequence and a number of organic layers 320 and inorganic layers 310 and 330 are not limited to the exemplary embodiment illustrated in FIG. 3A.

A touch film 400 may be disposed above the thin film encapsulation layer 300 to implement a touchscreen function of the display device 1. The touch film 400 may include a touch electrode of various patterns. The touch film 400 may be, for example, a resistive overlay touch film or a capacitive overlay touch film, etc.

Referring to FIG. 3B, in an exemplary embodiment, the storage capacitor Cst of the pixel circuit PC may be disposed such that it does not overlap the driving TFT T1, unlike the exemplary embodiment of FIG. 3A. For convenience of explanation, since the pixel PX of FIG. 3B is substantially the same as the pixel PX described with reference to FIG. 3A, a repeated description of elements previously described may be omitted below, and the differences between FIGS. 3A and 3B are primarily described below.

The first electrode CE1 of the storage capacitor Cst may include the same material as those of the gate electrodes G1 and G2 in a layer in which the gate electrodes G1 and G2 are disposed. The second electrode CE2 of the storage capacitor Cst may include the same material as those of the source electrodes S1 and S2 and the drain electrodes D1 and D2 in a layer in which the source electrodes S1 and S2 and the drain electrodes D1 and D2 are disposed. The interlayer insulating layer 107 may perform a function as a dielectric. As shown in FIG. 3A, rather than overlapping the driving TFT T1, the storage capacitor Cst is disposed adjacent to the driving TFT T1. In exemplary embodiments, the storage capacitor Cst may be disposed in other areas. For example, the storage capacitor Cst may be disposed on the opposite side of the TFT T1 relative to the embodiment shown in FIG. 3B. Further, the dielectric layer 105 included in the exemplary embodiment of FIG. 3A may not be included in the exemplary embodiment of FIG. 3B.

Although FIGS. 3A and 3B illustrate top-gate type TFTs in which the gate electrodes G1 and G2 of the first TFT T1 and the second TFT T2 are respectively disposed above the semiconductor layers A1 and A2 with the gate insulating layer 103 disposed therebetween, exemplary embodiments of the inventive concept are not limited thereto. For example, in exemplary embodiments, the first TFT T1 and the second TFT T2 may be bottom-gate type TFTs.

Although FIGS. 3A and 3B describe a structure in which the first TFT T1 is connected to the pixel electrode 221 through a via hole of the planarization layer 109, exemplary embodiments of the inventive concept are not limited thereto.

Although FIG. 2 illustrates a case in which a pixel PX includes two TFTs and one storage TFT, exemplary embodiments of the inventive concept are not limited thereto.

Referring to FIG. 4, in exemplary embodiments, in addition to including the driving and switching TFTs T1 and T2, the pixel circuit PC may further include a compensation TFT T3, a first initialization TFT T4, a first emission control TFT T5, a second emission control TFT T6, and a second initialization TFT T7.

A drain electrode of the driving TFT T1 may be electrically connected to an OLED through the second emission control TFT T6. The driving TFT T1 receives a data signal Dm through a data line DL and supplies a driving current to the OLED in response to a switching operation of the switching TFT T2.

A gate electrode of the switching TFT 12 is connected to a first scan line SLn, and a source electrode of the switching TFT T2 is connected to the data line DL. A drain electrode of the switching TFT T2 may be connected to a source electrode of the driving TFT T1 and connected to a driving voltage line PL through the first emission control TFT T5.

The switching TFT T2 performs a switching operation of being turned on in response to a first scan signal Sn transmitted via the first scan line SLn, and transmitting the data signal Dm through the data line DL to the source electrode of the driving TFT T1.

A gate electrode of the compensation TFT T3 may be connected to the first scan line SLn. A source electrode of the compensation TFT T3 may be connected to the drain electrode of the driving TFT T1 and connected to a pixel electrode of the OLED through the second emission control TFT T6. A drain electrode of the compensation TFT T3 may be connected to one of electrodes of the storage capacitor Cst, a source electrode of the first initialization TFT T4, and the gate electrode of the driving TFT T1. The compensation TFT T3 is turned on in response to the first scan signal Sn transmitted via the first scan line SLn and connects the gate electrode with the drain electrode of the driving TFT T1, thereby diode-connecting the driving TFT T1.

A gate electrode of the first initialization TFT T4 may be connected to a second scan line SLn−1. A drain electrode of the first initialization TFT T4 may be connected to an initialization voltage line VL. The source electrode of the first initialization TFT T4 may be connected to one of electrodes of the storage capacitor Cst, the drain electrode of the compensation TFT T3, and the gate electrode of the driving TFT T1. The first initialization TFT T4 may perform an initialization operation of being turned on in response to a second scan signal Sn−1 transmitted via the second scan line SLn−1, transmitting an initialization voltage VINT to the gate electrode of the driving TFT T1, and initializing a voltage of the gate electrode of the driving TFT T1.

A gate electrode of the first emission control TFT T5 may be connected to an emission control line EL. A source electrode of the first emission control TFT T5 may be connected to the driving voltage line PL. A drain electrode of the first emission control TFT T5 is connected to the source electrode of the driving TFT T1 and the drain electrode of the switching TFT T2.

A gate electrode of the second emission control TFT T6 may be connected to the emission control line EL. A source electrode of the second emission control TFT T6 may be connected to the drain electrode of the driving TFT T1 and the source electrode of the compensation TFT T3. A drain electrode of the second emission control TFT T6 may be electrically connected to the pixel electrode of the OLED. The first emission control TFT T5 and the second emission control TFT T6 are substantially simultaneously turned on in response to an emission control signal En transmitted via the emission control line EL, so that a driving voltage ELVDD is transmitted to the OLED, and a driving current flows through the OLED.

A gate electrode of the second initialization TFT T7 may be connected to a third scan line SLn+1. A source electrode of the second initialization TFT T7 may be connected to the pixel electrode of the OLED. A drain electrode of the second initialization TFT T7 may be connected to the initialization voltage line VL. The second initialization TFT T7 may be turned on in response to a third scan signal Sn+1 transmitted through the third scan line SLn+1 and may initialize the pixel electrode of the OLED.

One of the electrodes of the storage capacitor Cst may be connected to the driving voltage line PL, and one of the electrodes of the storage capacitor Cst may be connected to the gate electrode of the driving TFT T1, the drain electrode of the compensation TFT T3, and the source electrode of the first initialization TFT T4.

An opposite electrode of the OLED is connected to a common power voltage ELVSS. The OLED emits light by receiving a driving current from the driving TFT T1.

Figure 5:
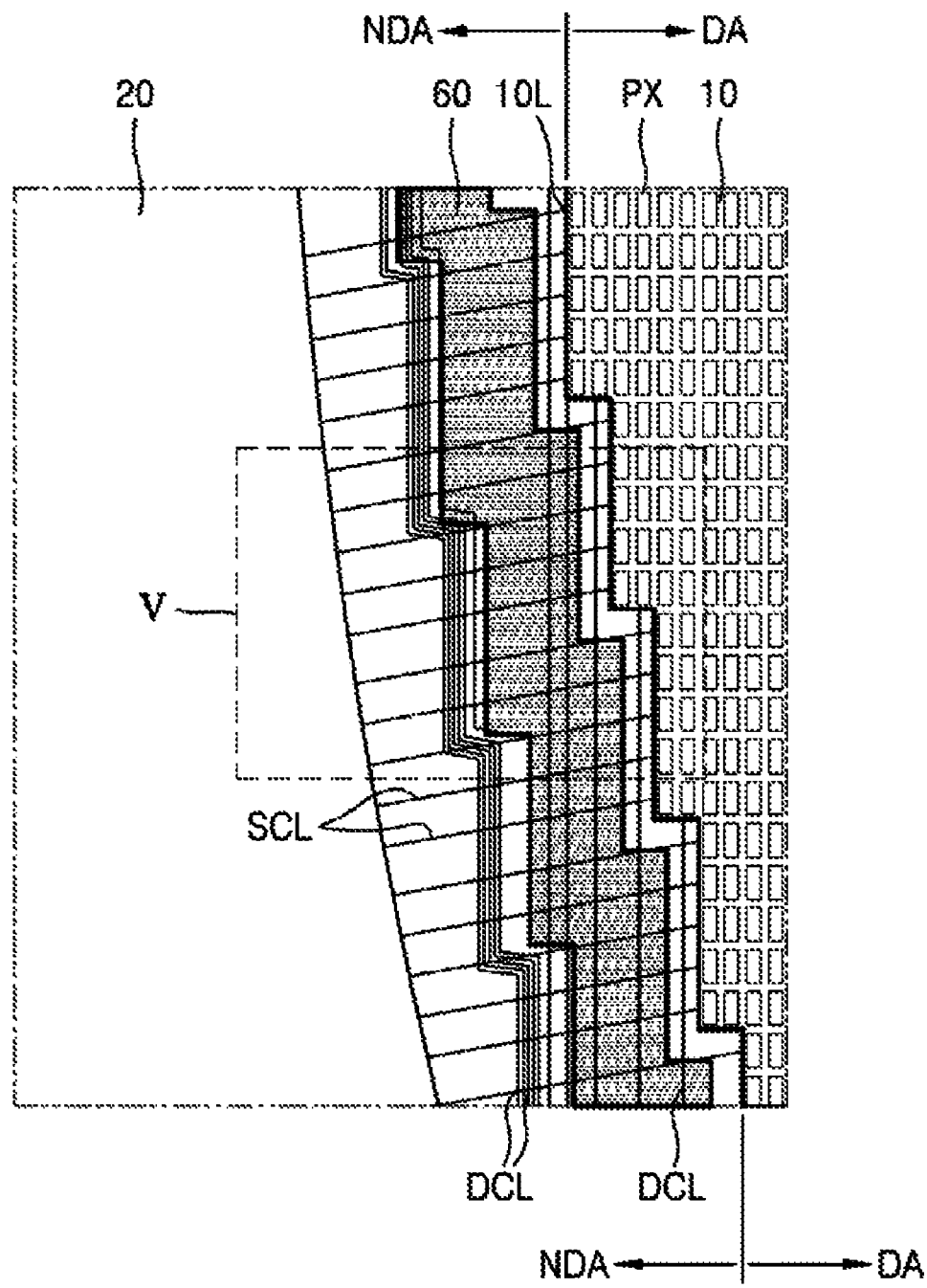
FIG. 5 is a plan view illustrating an enlarged view of portion I of FIG. 1 according to an exemplary embodiment of the inventive concept.

FIG. 5 is a plan view illustrating an enlarged view of portion I of FIG. 1 according to an exemplary embodiment of the inventive concept. The first scan driver 20 and a corresponding corner region 10C of the display portion 10 are described with reference to FIG. 5. It is to be understood that the second scan driver 30 and a corresponding corner region 10C of the display portion 10 have substantially the same structure as the structure shown in FIG. 5.

Referring to FIG. 5, pixels PX adjacent to an outer edge 10L of the display portion 10 are arranged in a stepwise configuration at the corner region 10C. For example, as illustrated in FIG. 5, pixels PX may be arranged in a stepwise configuration by two pixels PX along a horizontal direction and by five pixels PX along a vertical direction. Although FIG. 5 illustrates a case in which 2×5 pixels PX are arranged in a stepwise configuration, exemplary embodiments of the inventive concept are not limited thereto. For example, a number (N×M) of pixels PX may change, in which N and M are integers equal to at least 1.

The first scan driver 20 is spaced apart from the outer edge 10L of the display portion 10 above a non-display area NDA and transmits scan signals to the pixels PX arranged in each row via a scan connection line SCL. The scan connection line SCL integrally extends from the first scan driver 20 to the display portion 10. That is, in exemplary embodiments, the scan connection line SCL extends from the first scan driver 20 to the display portion 10 in a continuous manner without any breaks (e.g., the scan connection line SCL is a continuous line having no breaks between the contact holes CNT disposed at ends of the scan connection line SCL).

The driving voltage supply line 60 is disposed between the first scan driver 20 and the pixels PX arranged in a stepwise configuration. For example, as described with reference to FIG. 1, a portion (e.g. an end) of the driving voltage supply line 60 may extend into a space between the first scan driver 20 and the pixels PX.

The driving voltage supply line 60 may be bent along the stepwise arrangement of the pixels PX. For example, as illustrated in FIG. 5, the driving voltage supply line 60 may be bent in a stepwise configuration a plurality of number of times to maintain a relatively constant distance from the pixels PX (in plan view). Since the driving voltage supply line 60 extends while being bent along the arrangement of the pixels PX, the driving voltage supply line 60 may reduce a space between the pixels, and thus reduce an area of the non-display area NDA.

The driving voltage supply line 60 overlaps data connection lines DCL between the display portion 10 and the first scan driver 20. The driving voltage supply line 60 and the data connection lines DCL may overlap each other with at least one insulating layer disposed therebetween, thus reducing the area of the non-display area NDA. A description thereof is made below with reference to FIG. 6.

Figure 6:
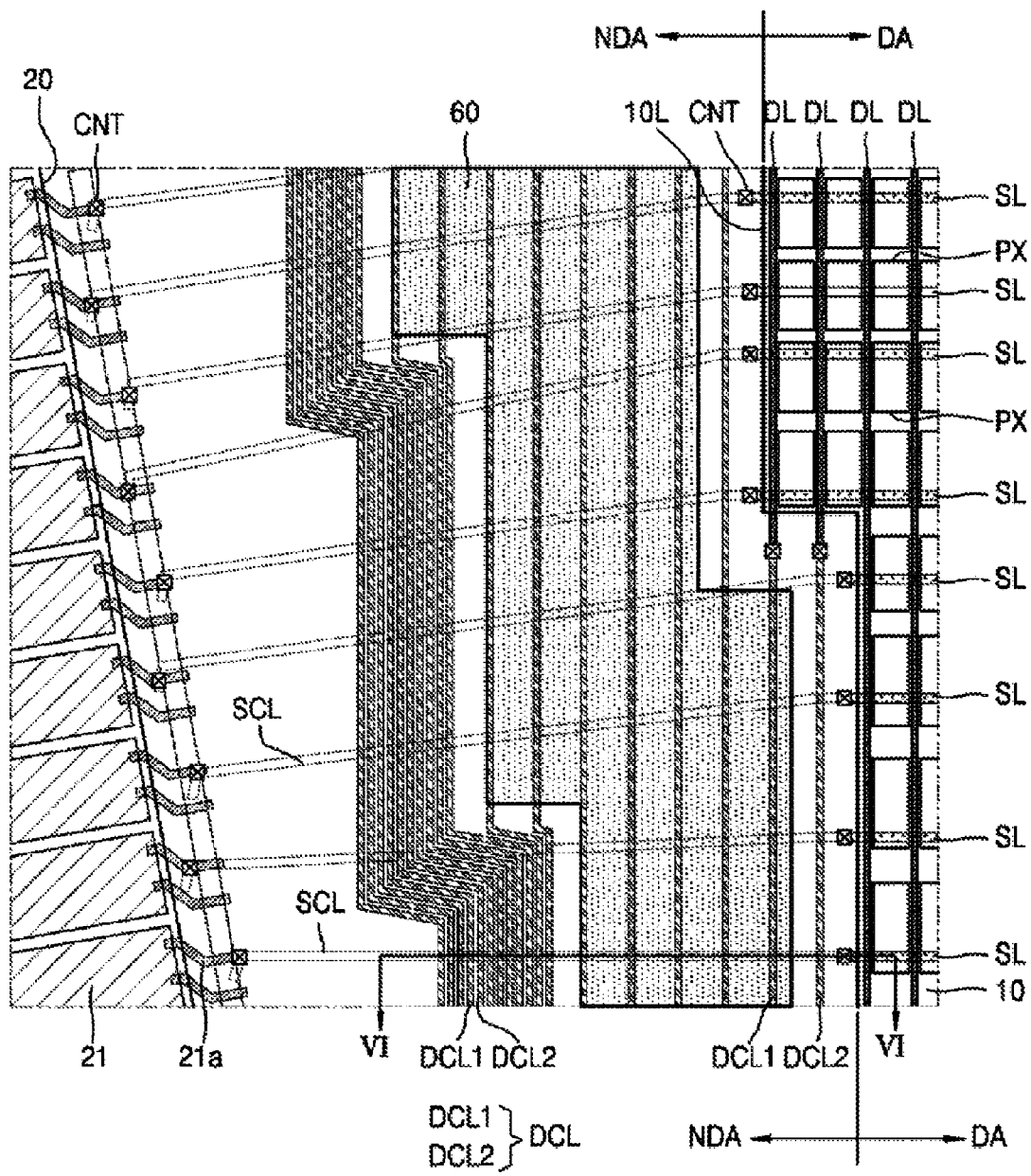
FIG. 6 is a plan view illustrating an enlarged view of portion V of FIG. 5 according to an exemplary embodiment of the inventive concept.

FIG. 6 is a plan view illustrating an enlarged view of portion V of FIG. 5 according to an exemplary embodiment of the inventive concept.

Referring to FIG. 6, pixels PX may be arranged in a matrix configuration in a display area DA, and arranged in a stepwise configuration in a region adjacent to the outer edge 10L of the display portion 10. The driving voltage supply line 60 is disposed between the pixels PX arranged in a stepwise configuration and the first scan driver 20, and is bent a plurality of number of times along the outer edge 10L of the display portion 10.

Scan lines SL and data lines DL extending to cross each other are disposed in the display area DA. The scan line SL and the data line DL are disposed in different layers with at least one insulating layer disposed therebetween. Herein, when elements X and Y are described as being disposed in different layers with (at least one) insulating layer disposed therebetween, a case in which one of X and Y is disposed below the (at least one) insulating layer and the other of X and Y is disposed above the (at least one) insulating layer is intended to be included. Further, when elements X and Y are described as being disposed in the same layer, a case in which elements X and Y are disposed above (e.g., directly above) the same insulating layer or below (e.g., directly below) the same insulating layer, and in which elements X and Y include the same material, is intended to be included.

The scan lines SL and the data lines DL connected to the pixels PX respectively receive signals from the first scan driver 20 and the data driver 40 (see FIG. 1) via a scan connection line SCL and a data connection line DCL.

First, the connection scheme of the scan connection line SCL and the scan line SL is described below.

The first scan driver 20 is spaced apart from the outer edge 10L near the pixels PX in the non-display area NDA. The first scan driver 20 includes a plurality of signal-generating units 21.

A scan signal generated by the signal-generating unit 21 may be transmitted to the scan line SL of pixels PX arranged in each row via the scan connection line SCL. For example, the signal-generating unit 21 may include a signal output terminal 21a protruding toward the display portion 10. The signal output terminal 21a may include the same material as that of the scan line SL and may be disposed in the same layer in which the scan line SL is disposed. In exemplary embodiments, a similar connection scheme utilizing a plurality of signal-generating units 21 may be utilized for the second scan driver 30.

The scan connection line SCL is connected to the signal output terminal 21a and the scan line SL via a contact hole CNT, and transmits a scan signal. The scan connection line SCL may be disposed in a layer different from layers in which the signal output terminal 21a and the scan line SL are disposed, and may include a material different from those of the signal output terminal 21a and the scan line SL. The scan connection line SCL is connected to the signal output terminal 21a and the scan line SL via the contact hole CNT (e.g., via two contact holes CNT respectively disposed at ends of the scan connection line SCL) passing through at least one insulating layer disposed between the scan connection line SCL, the signal output terminal 21a, and the scan line SL.

According to exemplary embodiments, the scan connection line SCL integrally extends from the first scan driver 20 (for example, at the signal output terminal 21a) to the scan line SL. That is, the scan connection line SCL extends from the first scan driver 20 to the scan line SL in a continuous manner without any breaks (other than the contact holes CNT provided at both ends of the scan connection line SCL). As a result, in exemplary embodiments, other than the contact holes CNT provided at both ends of the scan connection line SCL, a separate contact hole(s) for an electrical connection to other layers is not provided at the central portion of the scan connection line SCL between both ends of the scan connection line SCL (e.g., the central portion of the scan connection line SCL refers to the portion of the scan connection line SCL other than the ends of the scan connection line SCL at which the contact holes CNT are disposed). In a comparative example, in a case in which the scan connection line SCL includes two metallic layers spaced apart from each other with an insulating layer disposed therebetween, a separate contact hole for connecting the two metallic layers is formed in the central portion of the scan connection line SCL (e.g., in areas other than the ends of the scan connection line SCL). Since an area occupied by the contact hole and minimum spaced distances from neighbor wirings are required in the comparative example, in a case in which the contact hole(s) is provided at the central portion of the scan connection line SCL, an area for the contact hole is required, and a minimum margin between the contact hole and an adjacent element (e.g. wirings, devices, etc.) is required. Therefore, in the comparative example, there are limitations in regards to reducing the area of the non-display area.

However, according to exemplary embodiments of the inventive concept, the scan connection line SCL integrally extends from the first scan driver 20 to the scan line SL in a continuous manner without any breaks and without other constructions, such as a contact hole(s) in the central portion of the scan connection line SCL. As a result, the area of the non-display area in exemplary embodiments of the inventive concept may be reduced.

Next, the connection scheme between the data connection line DCL and the data line DL is described below.

A data signal generated by the data driver 40 (see FIG. 1) may be transmitted to the data line DL of pixels PX arranged in each column via the data connection lines DCL. The data connection line DCL may be disposed in a layer different from a layer in which the data line DL is disposed, and may include a material different from that of the data line DL. Therefore, the data connection line DCL is connected to the data line DL via a contact hole CNT (e.g., a contact hole CNT other than the contact holes CNT that connect the scan connection lines SCL to the scan lines SL, and the scan connection lines SCL to the signal output terminals 21a, respectively) passing through at least one insulating layer disposed between the data connection line DCL and the data line DL. The contact hole CNT connecting the data connection line DCL and the data line DL may be disposed in the same insulating layer(s) through which the other contact holes CNT are disposed, and/or in a different insulating layer(s) through which the other contact holes CNT are disposed.

All of the data connection lines DCL may be disposed in the same layer and may include the same material. For example, adjacent first and second data connection lines DCL1 and DCL2 may both be disposed in the same layer and may include the same material.

The data connection lines DCL may be disposed between the pixels PX arranged in a stepwise configuration and the first scan driver 20, and may be bent in a stepwise configuration a plurality of number of times. At least one data connection line DCL may overlap the driving voltage supply line 60, thus reducing the area of the non-display area NDA. Furthermore, in exemplary embodiments, to prevent or reduce a mutual electrical connection, the data connection line DCL, the driving voltage supply line 60, and the scan connection line SCL are disposed in different layers with at least one insulating layer disposed therebetween.

Figure 7A:
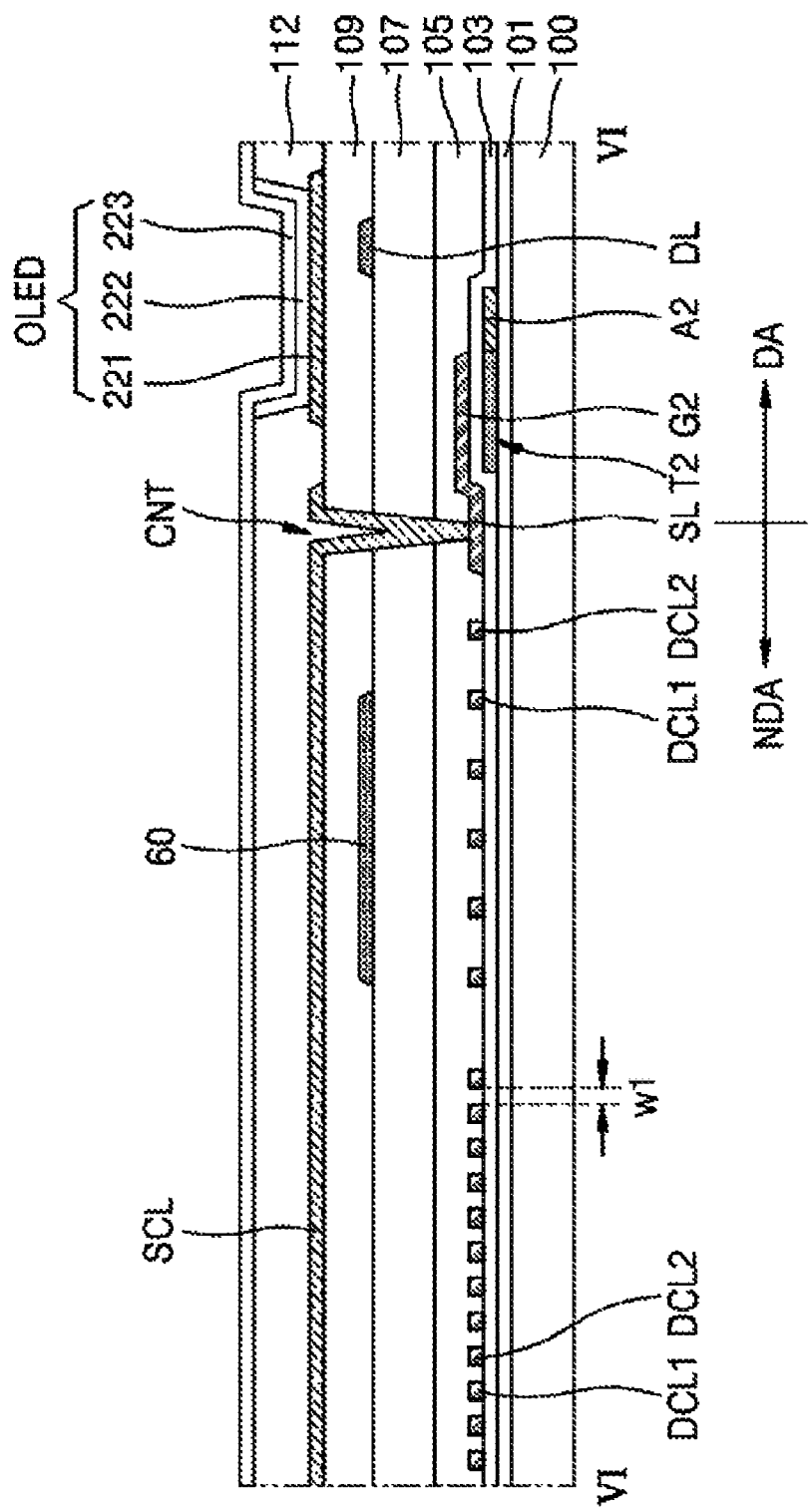
FIGS. 7A and 7B are cross-sectional views taken along line VI-VI of FIG. 6 according to exemplary embodiments of the inventive concept.
Figure 7B:
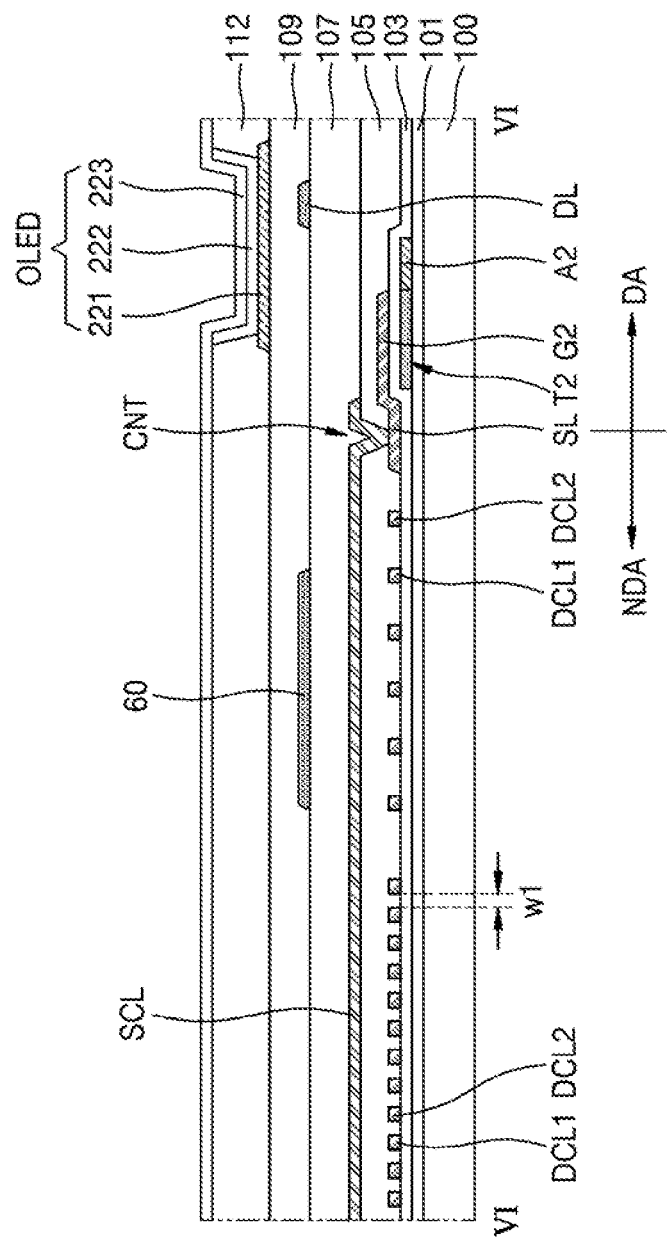

FIGS. 7A and 7B are cross-sectional views taken along line VI-VI of FIG. 6, according to exemplary embodiments of the inventive concept. For convenience of description, FIGS. 7A and 7B omit the thin film encapsulation layer 300 and the touch film 400.

Referring to FIGS. 7A and 7B, a pixel PX may have the cross-sectional structure described above with reference to FIG. 3A.

Referring to FIGS. 7A, 7B, and 3A, a portion of the scan line SL passing across the display area DA becomes the gate electrode G2 of the switching TFT T2. In addition, the data line DL is disposed in the same layer in which the source electrode S2 and the drain electrode D2 of the switching TFT T2 are disposed, and includes the same material as those of the source electrode S2 and the drain electrode D2 of the switching TFT T2.

In the non-display area NDA, data connection lines DCL (e.g., DCL1 and DCL2) are disposed in the same layers in which the scan line SL and the gate electrode G2 of the switching TFT T2 are disposed, and include the same material as those of the scan line SL and the gate electrode G2 of the switching TFT T2. The driving voltage supply line 60 is disposed in the same layer in which the data line DL is disposed, and includes the same material as that of the data line DL. A portion of the data connection lines DCL overlaps the driving voltage supply line 60 with the dielectric layer 105 and the interlayer insulating layer 107 disposed therebetween.

The scan connection line SCL overlaps the data connection line DCL and the driving voltage supply line 60. The scan connection line SCL, may be disposed above the data connection line DCL and the driving voltage supply line 60 in an exemplary embodiment (see FIG. 7A), or disposed between the data connection line DCL and the driving voltage supply line 60 in an exemplary embodiment (see FIG. 7B).

Referring to FIG. 7A, the scan connection line SCL may be disposed in the same layer in which the pixel electrode 221 is disposed, and may include the same material as that of the pixel electrode 221. The scan connection line SCL is connected to the scan line SL via a contact hole CNT passing through the dielectric layer 105, the interlayer insulating layer 107, and the planarization layer 109. An interval between the first and second data connection lines DCL1 and DCL2 is represented in FIG. 7A by w1.

Referring to FIG. 7B, the scan connection line SCL may be disposed in the same layer in which the second electrode CE2 of the storage capacitor Cst described with reference to FIG. 3A is disposed, and may include the same material as that of the second electrode CE2. The scan connection line SCL is connected to the scan line SL via a contact hole CNT passing through the dielectric layer 105. An interval between the first and second data connection lines DCL1 and DCL2 is represented in FIG. 7B by w1.

Figure 8:
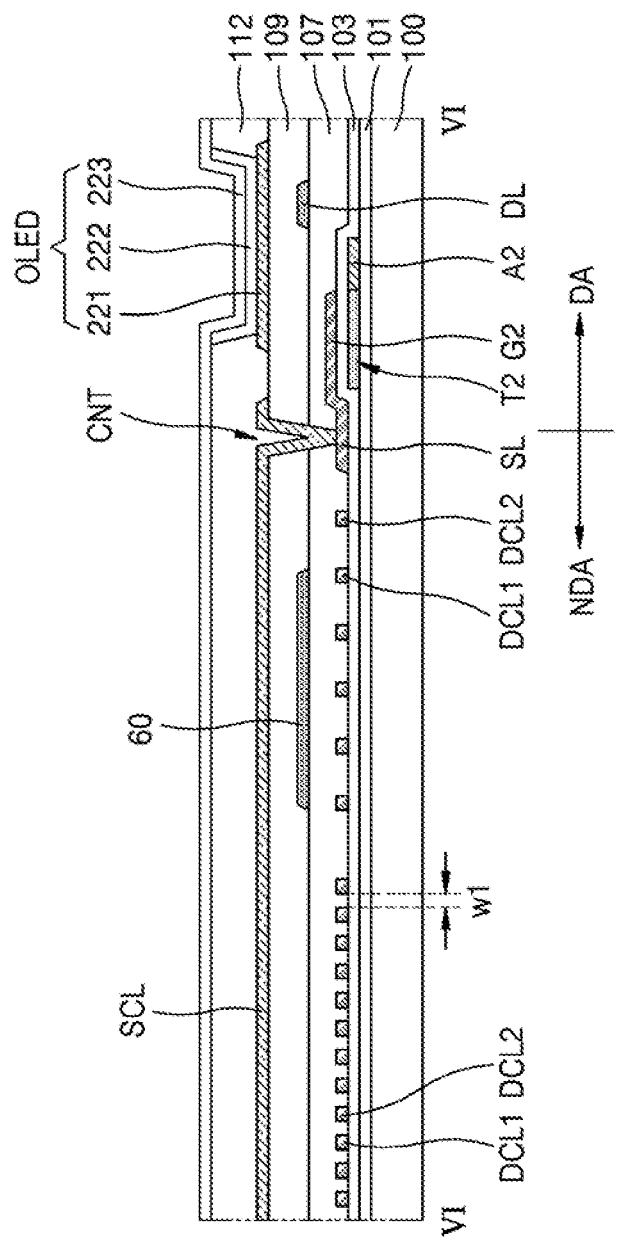
FIG. 8 is a cross-sectional view taken along line VI-VI of FIG. 6 according to an exemplary embodiment of the inventive concept.

FIG. 8 is a cross-sectional view taken along line VI-VI of FIG. 6 according to an exemplary embodiment of the inventive concept. For convenience of description, FIG. 8 omits the thin film encapsulation layer 300 and the touch film 400.

Referring to FIG. 8, the pixel PX may have the cross-sectional structure described with reference to FIG. 3B. The exemplary embodiment illustrated in FIG. 8 differs from the exemplary embodiment described with reference to FIG. 7 in that the storage capacitor Cst of the pixel circuit PC does not overlap the driving TFT T1 and the dielectric layer 105 is omitted.

Referring to FIGS. 8 and 3B, a portion of the scan line SL passing across the display area DA becomes the gate electrode G2 of the switching TFT T2. In addition, the data line DL is disposed in the same layer in which the source electrode S2 and the drain electrode D2 of the switching TFT T2 are disposed, and includes the same material as those of the source electrode S2 and the drain electrode D2 of the switching TFT T2.

In the non-display area NDA, the data connection lines DCL (e.g., DCL1 and DCL2) are disposed in the same layers in which the scan line SL and the gate electrode G2 of the switching TFT T2 are disposed, and include the same material as those of the scan line SL and the gate electrode G2 of the switching TFT T2. The driving voltage supply line 60 is disposed in the same layer in which the data line DL is disposed and includes the same material as that of the data line DL. A portion of the data connection lines DCL overlaps the driving voltage supply line 60 with the interlayer insulating layer 107 disposed therebetween.

The scan connection line SCL overlaps the data connection line DCL and the driving voltage supply line 60. The scan connection line SCL may be disposed above the data connection line DCL and the driving voltage supply line 60. For example, the scan connection line SCL may be disposed in the same layer in which the pixel electrode 221 is disposed, and may include the same material as that of the pixel electrode 221. The scan connection line SCL is connected to the scan line SL via a contact hole CNT passing through the interlayer insulating layer 107 and the planarization layer 109. An interval between the first and second data connection lines DCL1 and DCL2 is represented in FIG. 8 by w1.

Figure 9:
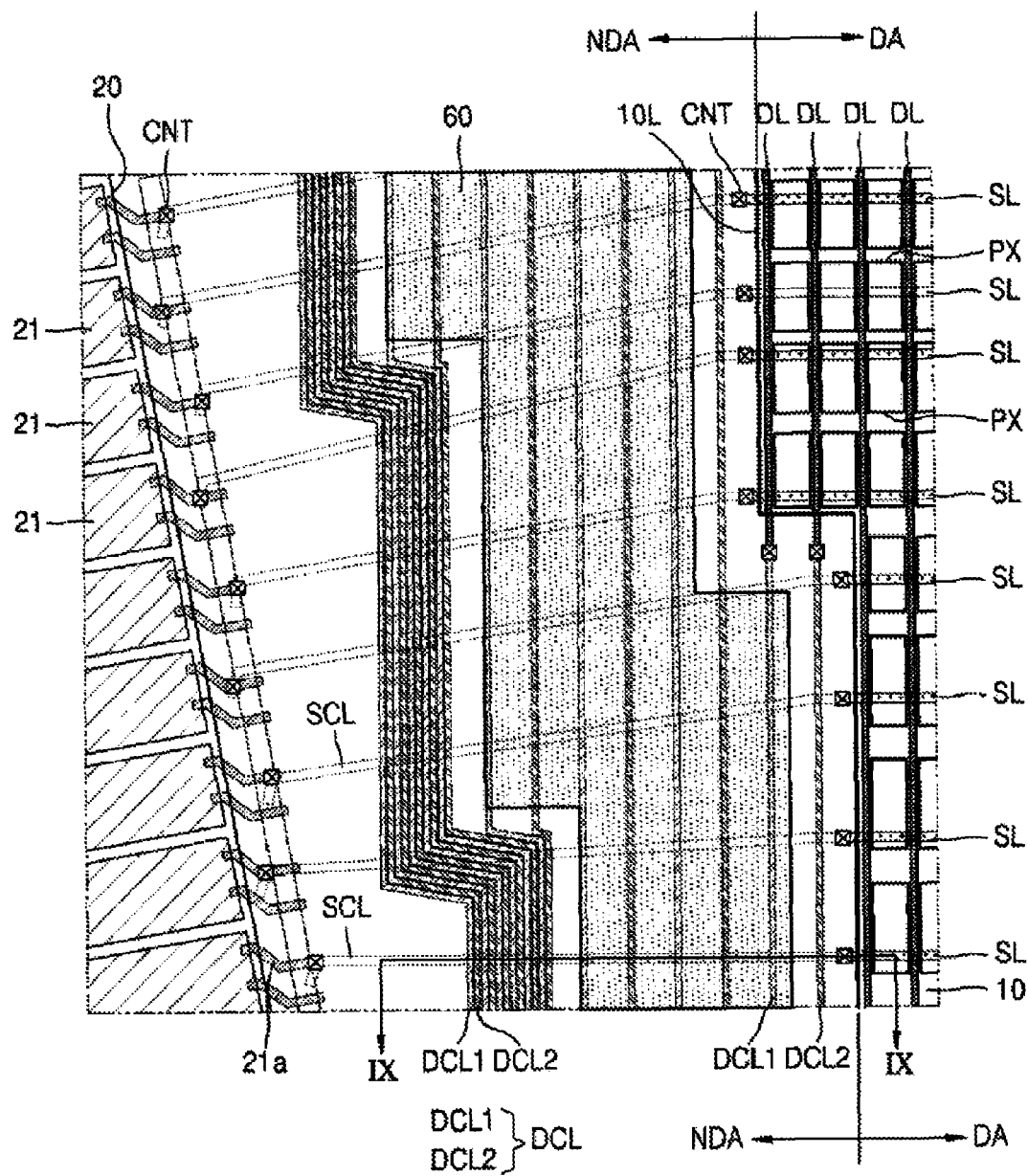
FIG. 9 is a plan view illustrating an enlarged view of portion V of FIG. 5 according to an exemplary embodiment of the inventive concept.

FIG. 9 is a plan view illustrating an enlarged view of portion V of FIG. 5 according to an exemplary embodiment of the inventive concept.

Referring to FIG. 9, pixels PX are connected to the scan line SL and the data line DL, which are disposed in different layers. The pixels PX may be arranged in a matrix configuration in a display area DA, and arranged in a stepwise configuration in a region adjacent to the outer edge 10L of the display portion 10. The driving voltage supply line 60 is disposed between the pixels PX arranged in a stepwise configuration and the first scan driver 20, and is bent a plurality of number of times along the outer edge 10L of the display portion 10.

The scan lines SL and the data lines DL connected to the pixels PX respectively receive signals from the first scan driver 20 and the data driver 40 (see FIG. 1) via the scan connection line SCL and the data connection line DCL.

A scan signal generated by the signal-generating unit 21 of the first scan driver 20 may be transmitted to the scan line SL of pixels PX arranged in each row via the scan connection line SCL. For example, the signal-generating unit 21 may include the signal output terminal 21a protruding toward the display portion 10 and including the same material as that of the scan line SL.

The scan connection line SCL is connected to the signal output terminal 21a and the scan line SL via a contact hole CNT and transmits a scan signal. The scan connection line SCL is disposed in a layer different from layers in which the signal output terminal 21a and the scan line SL are disposed, and is connected to the signal output terminal 21a and the scan line SL via the contact hole CNT.

A data signal generated by the data driver 40 (see FIG. 1) may be transmitted to the data line DL of pixels PX arranged in each column via the data connection lines DCL.

Data connection lines DCL may be alternately disposed above and below an insulating layer. That is, the insulating layer may be disposed between alternately disposed data connection lines DCL. For example, one of adjacent first and second data connection lines DCL1 and DCL2 may be disposed above the insulating layer, and the other one of the adjacent first and second data connection lines DCL1 and DCL2 may be disposed below the insulating layer, with the insulating layer disposed therebetween.

The data connection lines DCL are disposed in a layer different from a layer in which the data line DL is disposed. Therefore, each of the data connection lines DCL is connected to the data line DL via a contact hole CNT passing through at least one insulating layer disposed between the data connection line DCL and the data line DL.

The data connection lines DCL may be disposed between the pixels PX arranged in a stepwise configuration, and the first scan driver 20 and may be bent in a stepwise configuration a plurality of number of times. At least one data connection line DCL may overlap the driving voltage supply line 60, thus reducing the area of the non-display area NDA. Furthermore, to prevent or reduce a mutual electrical connection, the data connection line DCL, the driving voltage supply line 60, and the scan connection line SCL are disposed in different layers with at least one insulating layer disposed therebetween.

Figure 10:
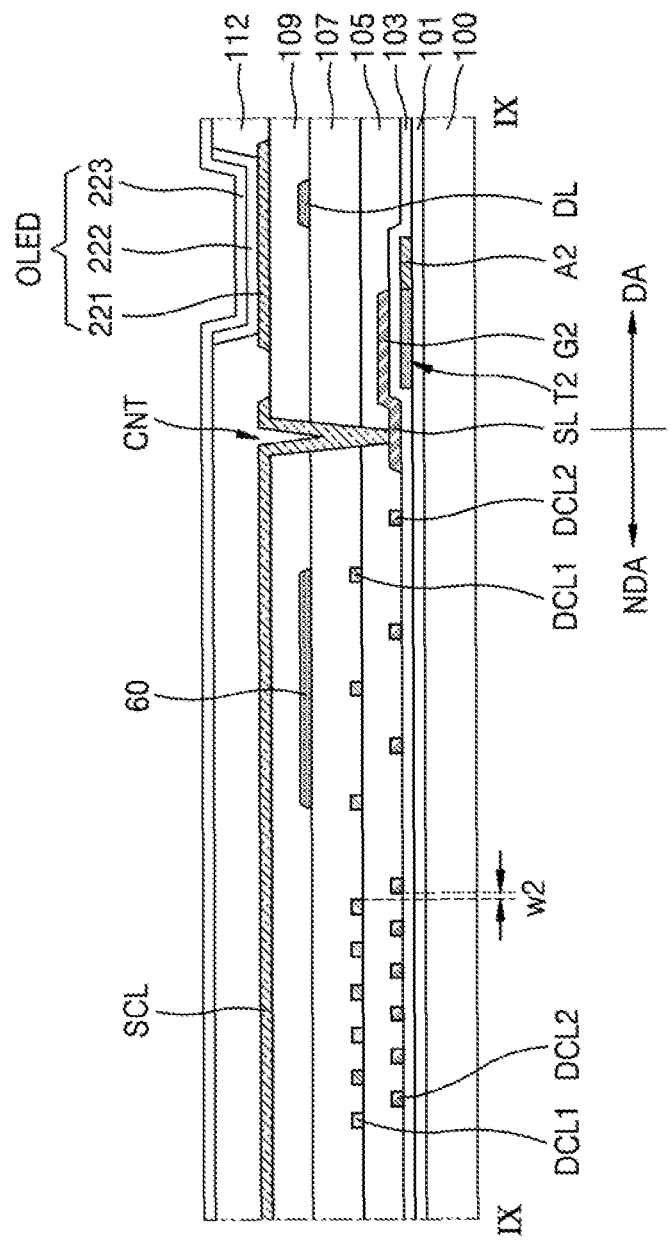
FIG. 10 is a cross-sectional view taken along line IX-IX of FIG. 9 according to an exemplary embodiment of the inventive concept.

FIG. 10 is a cross-sectional view taken along line IX-IX of FIG. 9 according to an exemplary embodiment of the inventive concept. For convenience of description, FIG. 10 omits the thin film encapsulation layer 300 and the touch film 400.

Referring to FIG. 10, a pixel PX may have the cross-sectional structure described above with reference to FIG. 3A. A portion of the scan line SL passing across the display area DA becomes the gate electrode G2 of the switching TFT T2. In addition, the data line DL is disposed in the same layer in which the source electrode S2 and the drain electrode D2 of the switching TFT T2 are disposed, and includes the same material as those of the source electrode S2 and the drain electrode D2 of the switching TFT T2.

In the non-display area NDA, the data connection lines DCL overlap the driving voltage supply line 60 disposed in the same layer in which the data line DL is disposed, and includes the same material as that of the data line DL.

The data connection lines DCL may be alternately disposed above and below the dielectric layer 105, with the dielectric layer 105 disposed therebetween. For example, adjacent first data connection line DCL1 and second data connection line DCL2 are respectively disposed above and below the dielectric layer 105.

The first data connection line DCL1 is disposed in the same layer in which the second electrode CE2 of the storage capacitor Cst described with reference to FIG. 3A is disposed, and includes the same material as that of the second electrode CE2 of the storage capacitor Cst. The second data connection line DCL2 is disposed in the same layer in which the scan line SL, the switching TFT T2, the gate electrode G2, and the first electrode CE1 of the storage capacitor Cst are disposed, and includes the same material as those of the scan line SL, the switching TFT T2, the gate electrode G2, and the first electrode CE1 of the storage capacitor Cst. In an exemplary embodiment, the first data connection line DCL1 may include, for example, Mo, and the second data connection line DCL2 may include, for example, Mo or Mo/Al/Mo.

Since the first and second connection lines DCL1 and DCL2 are disposed in different layers, an interval w2 between the first and second data connection lines DCL1 and DCL2 may be less than the interval w1 between the first and second data connection lines DCL1 and DCL2 in the exemplary embodiments described above with reference to FIGS. 7A to 8. Therefore, the area of the non-display area NDA may be further reduced.

In the exemplary embodiment illustrated in FIG. 10, the first and second data connection lines DCL1 and DCL2 do not overlap each other. That is, in exemplary embodiments, neighboring/adjacent (e.g., directly adjacent) data connection lines (e.g., first and second data connection lines DCL1 and DCL2) do not overlap each other. Since the first and second data connection lines DCL1 and DCL2 do not overlap each other, interference that may occur between data signals due to overlapping first and second data connection lines DCL1 and DCL2 may be prevented or reduced. Although FIG. 10 illustrates a case in which the interval w2 between the first and second data connection lines DCL1 and DCL2 is greater than 0, exemplary embodiments of the inventive concept are not limited thereto. For example, in exemplary embodiments, when the first and second data connection lines DCL1 and DCL2 do not overlap each other, the interval w2 between them may be substantially equal to 0 (e.g., exactly equal to 0, or about equal to 0 within a measurement error as would be understood by a person having ordinary skill in the art).

Although FIG. 10 illustrates an exemplary embodiment in which the first data connection line DCL1 is disposed above the dielectric layer 105 and the second data connection line DCL2 is disposed below the dielectric layer 105, exemplary embodiments of the inventive concept are not limited thereto. For example, according to exemplary embodiments, the arrangement of the first and second data connection lines DCL1 and DCL2 relative to the dielectric layer 105 may be changed.

The scan connection line SCL may overlap the data connection line DCL and the driving voltage supply line 60. The scan connection line SCL may be disposed above the data connection line DCL and the driving voltage supply line 60. For example, the scan connection line SCL may be disposed in the same layer in which the pixel electrode 221 is disposed, and may include the same material as that of the pixel electrode 221.

Figure 11:
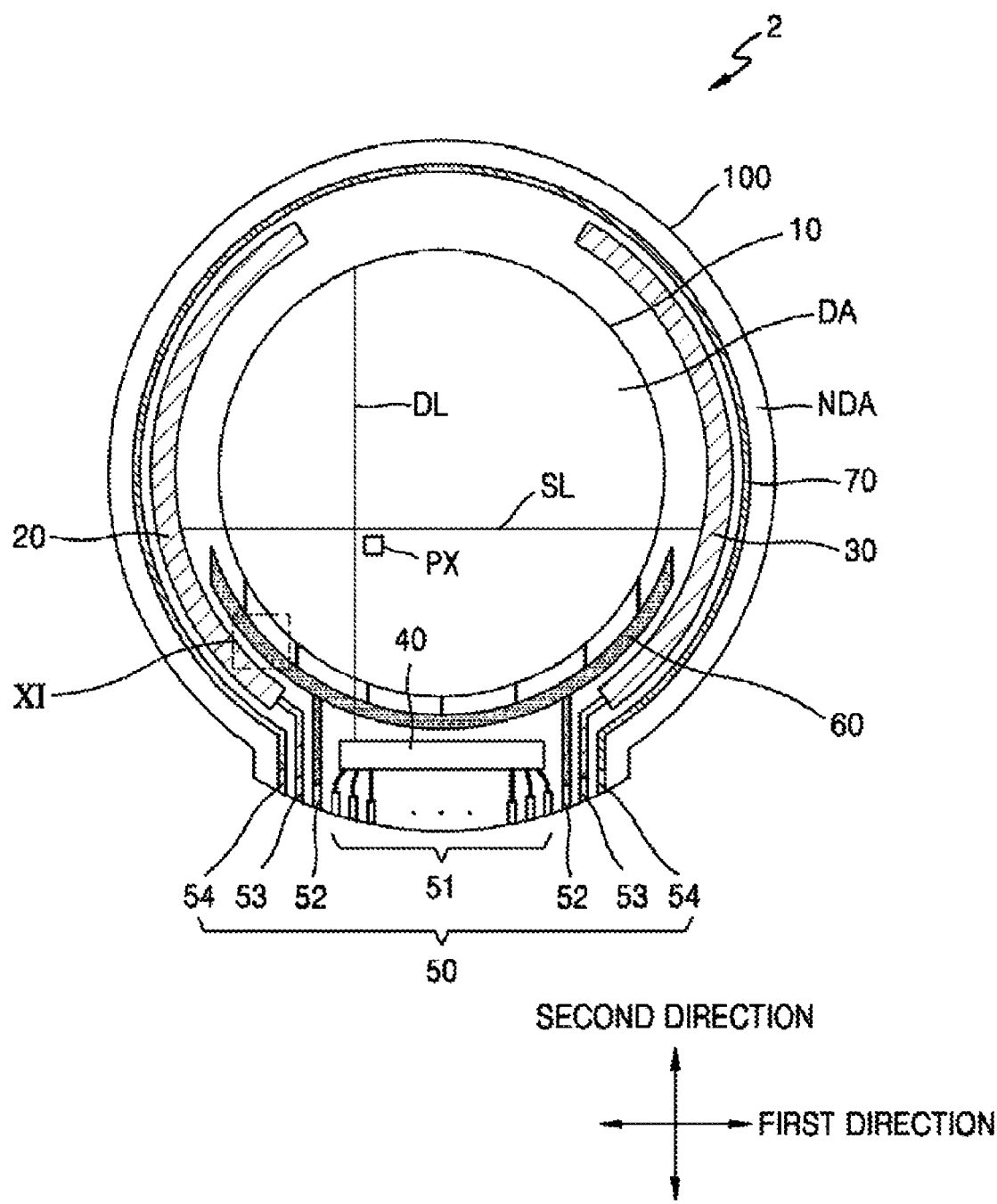
FIG. 11 is a plan view illustrating a display device according to an exemplary embodiment of the inventive concept.
Figure 12:
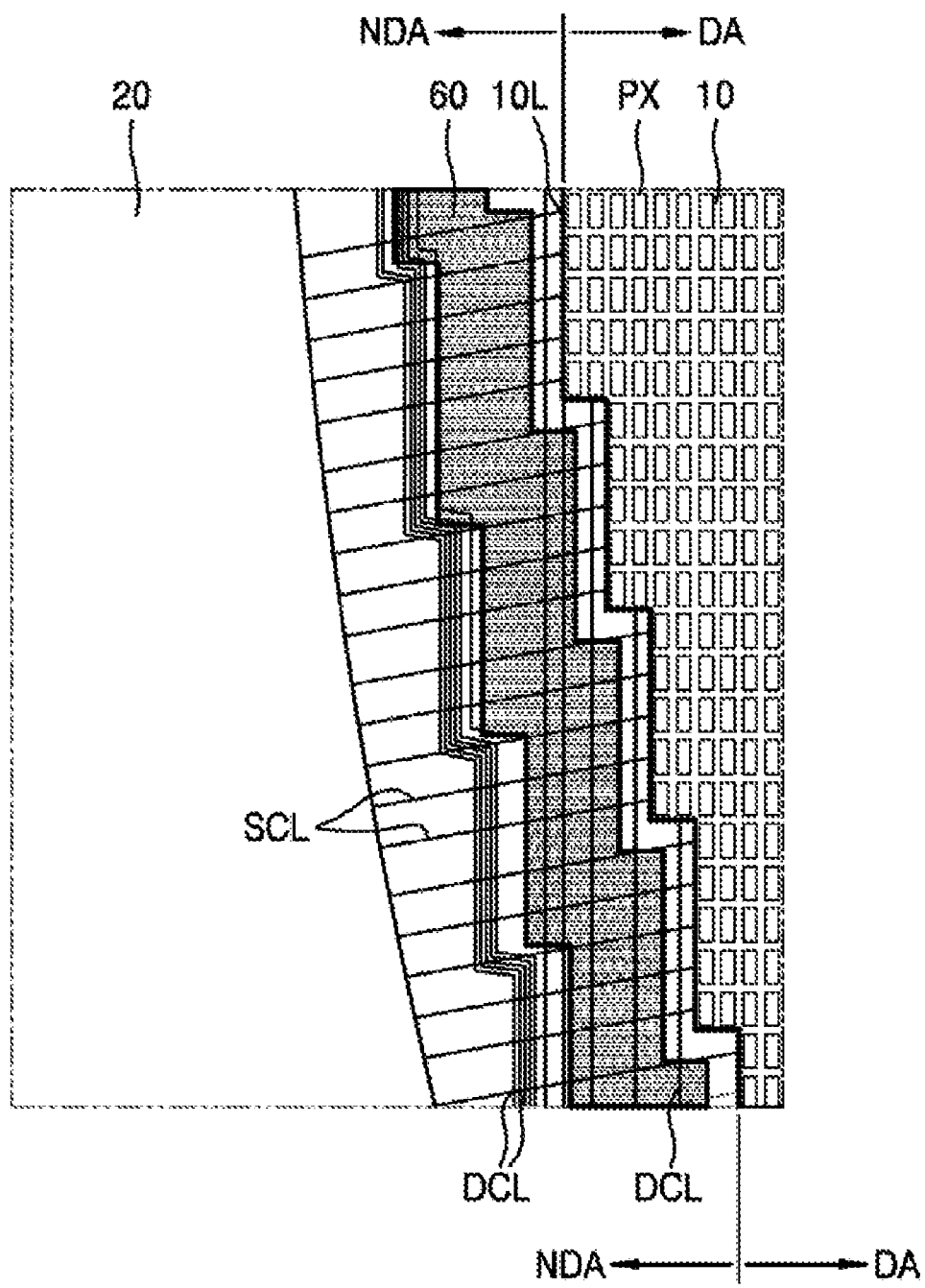
FIG. 12 is a view illustrating an enlarged view of portion XI of FIG. 11 according to an exemplary embodiment of the inventive concept.
Figure 13:
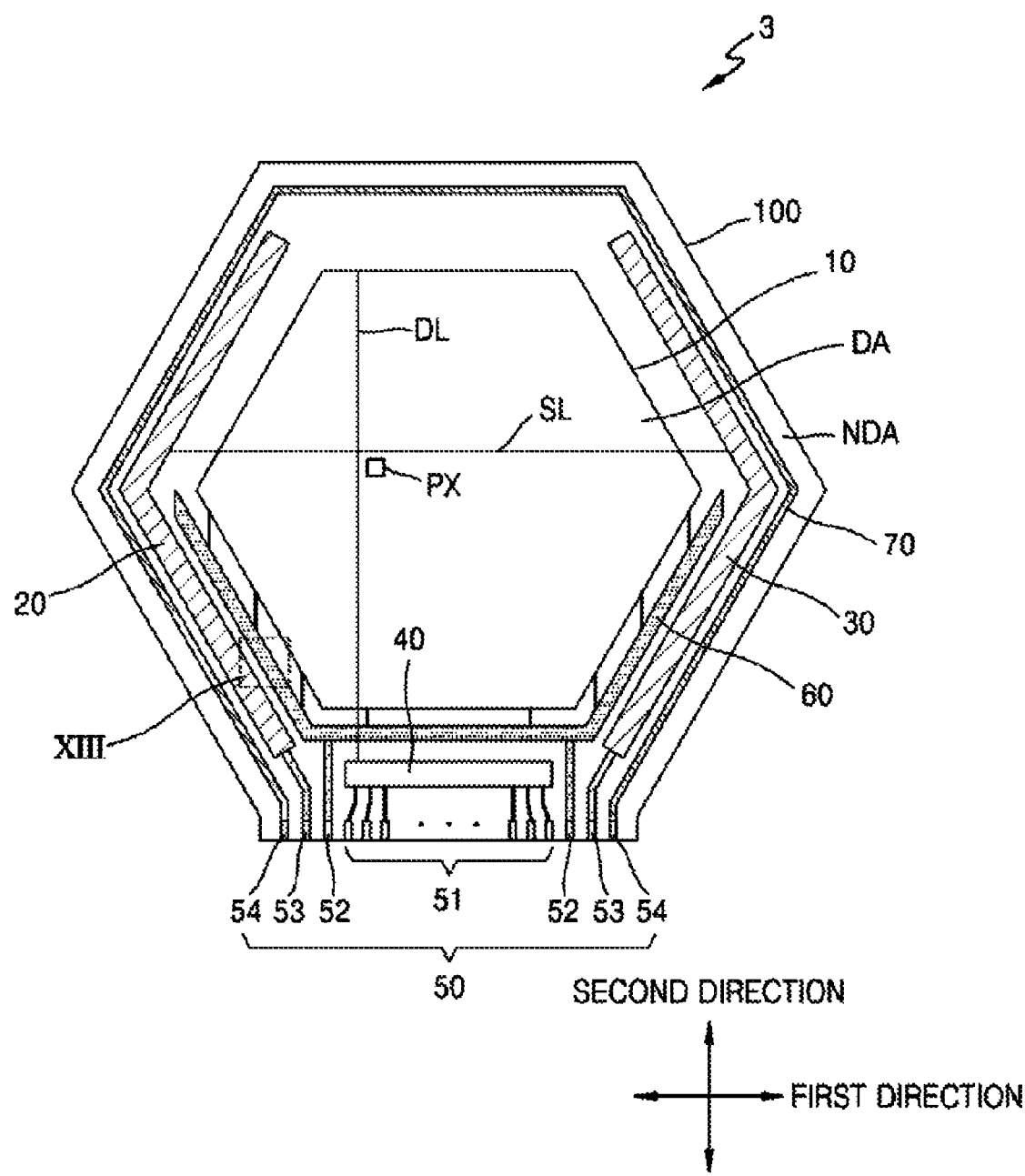
FIG. 13 is a plan view illustrating a display device according to an exemplary embodiment of the inventive concept.
Figure 14:
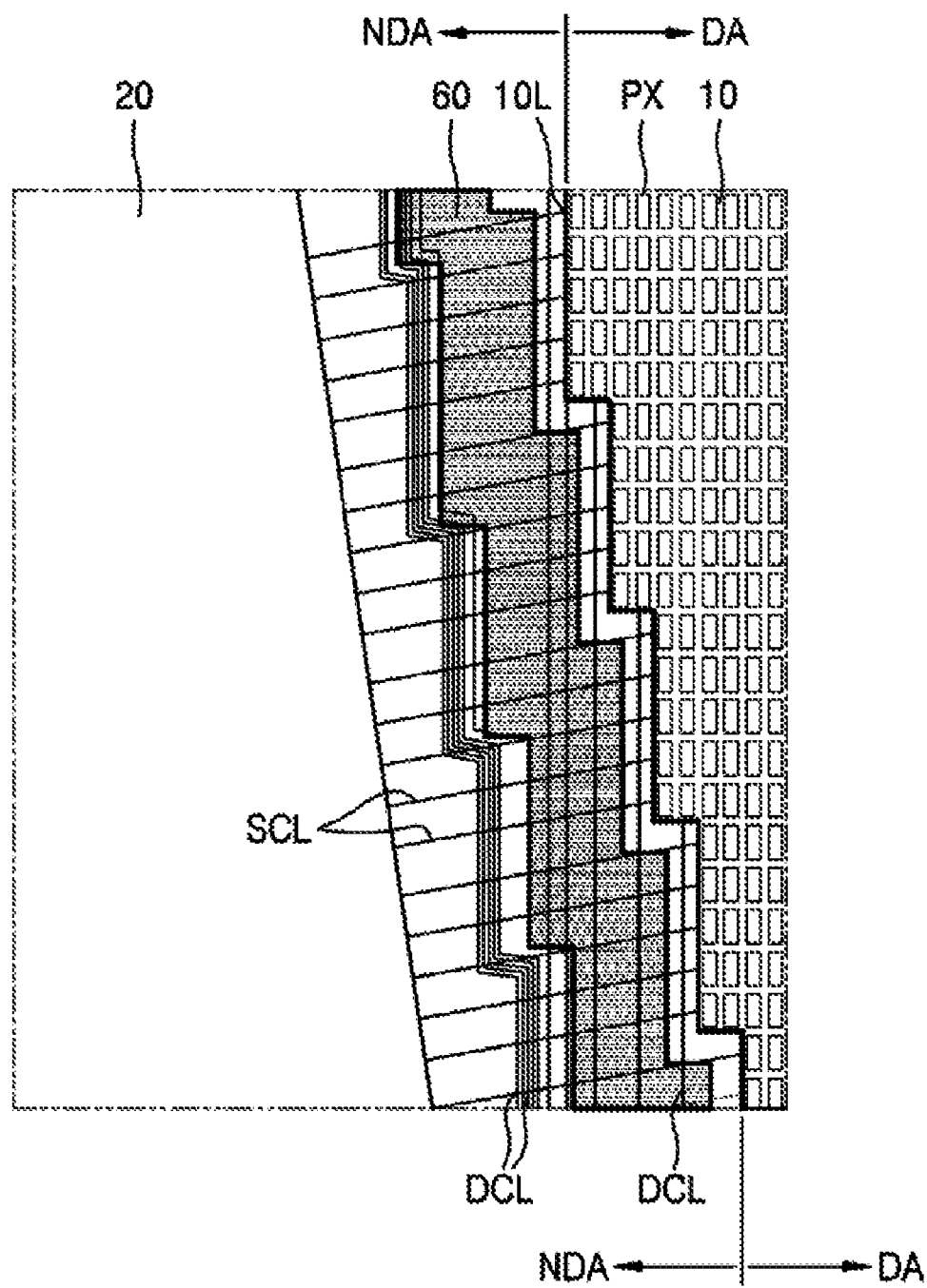
FIG. 14 is a view illustrating an enlarged view of portion XIII of FIG. 13 according to an exemplary embodiment of the inventive concept.

FIG. 11 is a plan view illustrating a display device 2 according to an exemplary embodiment of the inventive concept. FIG. 12 is a view illustrating an enlarged view of portion XI of FIG. 11 according to an exemplary embodiment of the inventive concept. FIG. 13 is a plan view illustrating a display device 3 according to an exemplary embodiment of the inventive concept. FIG. 14 is a view illustrating an enlarged view of portion XIII of FIG. 13 according to an exemplary embodiment of the inventive concept.

Referring to FIGS. 11 and 13, the display devices 2 and 3 include an approximately circular or hexagonal-shaped display portion 10. The first and second scan drivers 20 and 30 may be rounded along the shape of the display portion 10 at both sides of the display portion 10. The data driver 40 may be disposed on one side of the display portion 10 adjacent to the terminal unit 50.

The driving voltage supply line 60 is disposed between the data driver 40 and the display portion 10, and supplies a driving voltage ELVDD to a pixel PX. The common voltage supply line 70 surrounds the display portion 10 except on one side of the substrate 100 to which the terminal unit 50 is provided, and supplies a common voltage ELVSS to the opposite electrode of the OLED of the pixel PX.

Referring to FIGS. 12 and 14, both ends of the driving voltage supply line 60 of the display devices 2 and 3 extend and are disposed between the display portion 10 and the first and second scan drivers 20 and 30, and overlap the data connection lines DCL between the display portion 10 and the first and second scan drivers 20 and 30.

The data connection lines DCL and the driving voltage supply line 60 may be bent along the outer edge 10L of the display portion 10 formed by pixels PX arranged in a stepwise configuration, may be disposed in different layers with at least one insulating layer disposed therebetween, and may overlap each other, thereby reducing the area of the non-display area NDA.

The scan connection line SCL connecting the first and second scan drivers 20 and 30 with the scan line SL extends toward the scan line SL, overlaps the data connection line DCL and the driving voltage supply line 60, and is disposed in a layer different from layers in which the data connection line DCL and the driving voltage supply line 60 are disposed.

Since the construction, structure, and stacking structure of the display devices 2 and 3 of FIGS. 11 to 14 are substantially the same as those described with reference to FIGS. 1 to 10, a further detailed description thereof is omitted.

Exemplary embodiments of the inventive concept in which the display portion 10 has an approximately quadrangular, circular, and hexagonal shape have been described above. However, exemplary embodiments of the inventive concept are not limited thereto. For example, in exemplary embodiments, the display portion 10 may have, for example, an approximately elliptical shape, and may have various polygonal shapes such as triangular and pentagonal shapes.

Figure 15:
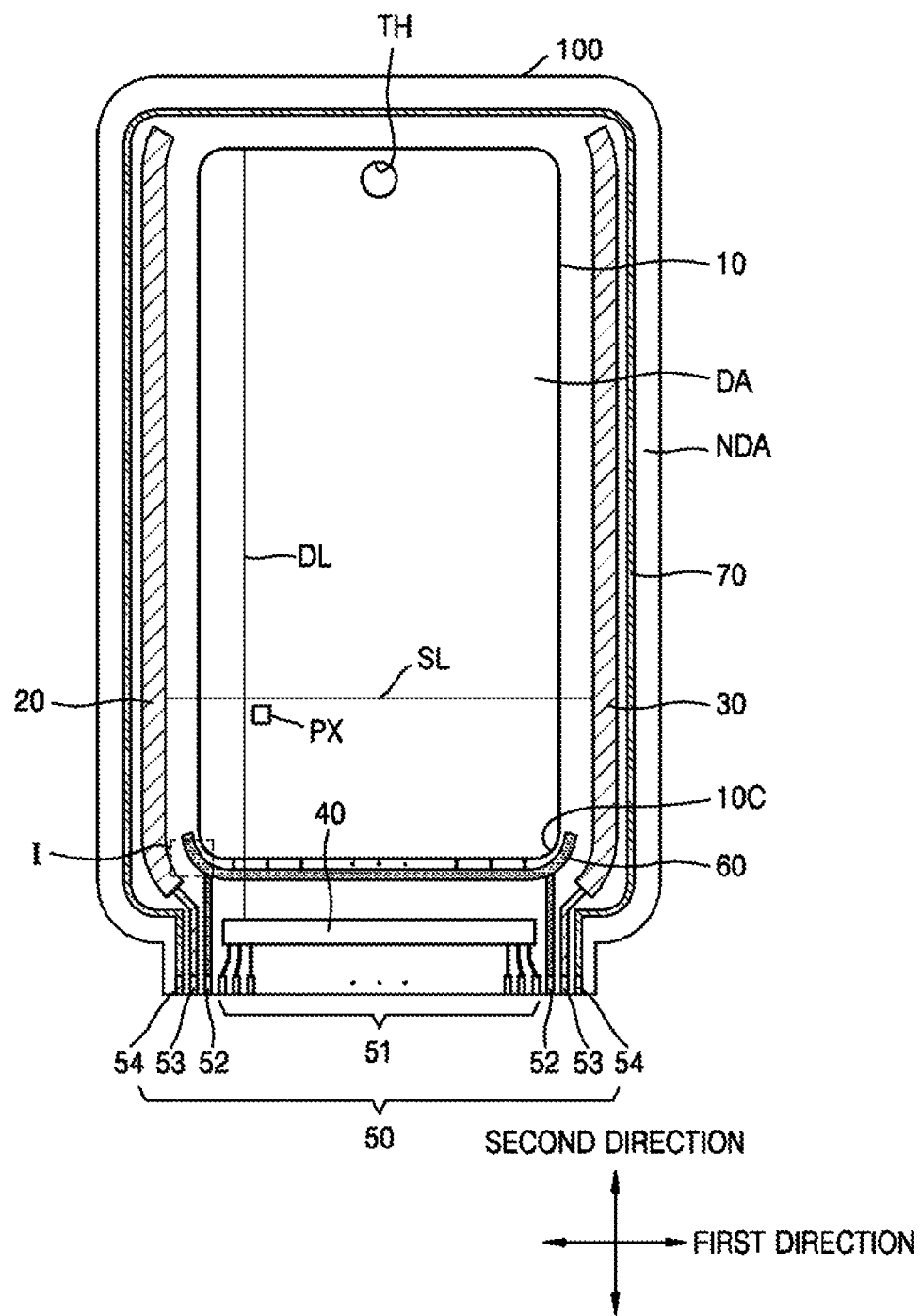
FIGS. 15 to 17 are plan views respectively illustrating modified exemplary embodiments of FIG. 1.
Figure 16:
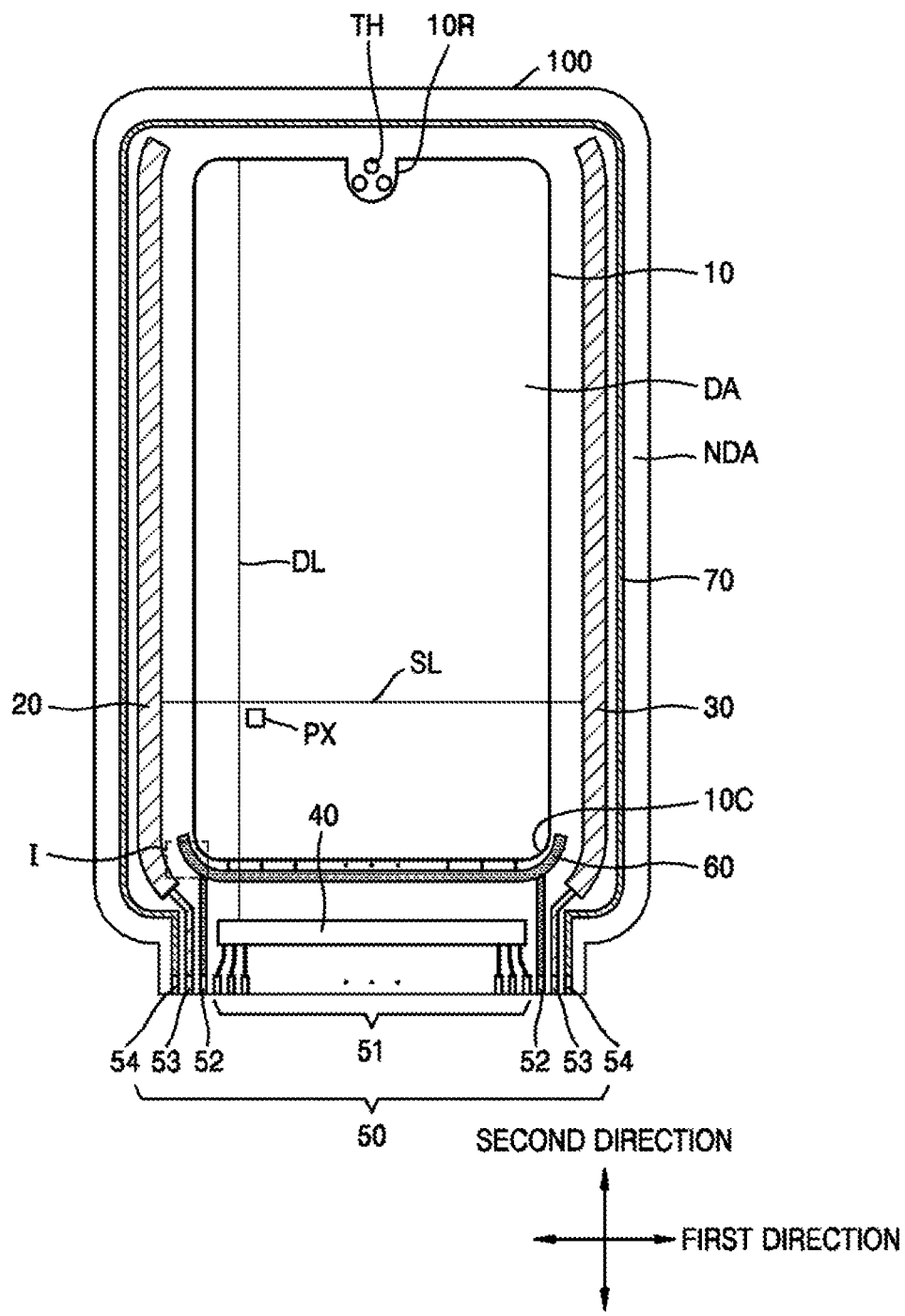
Figure 17:
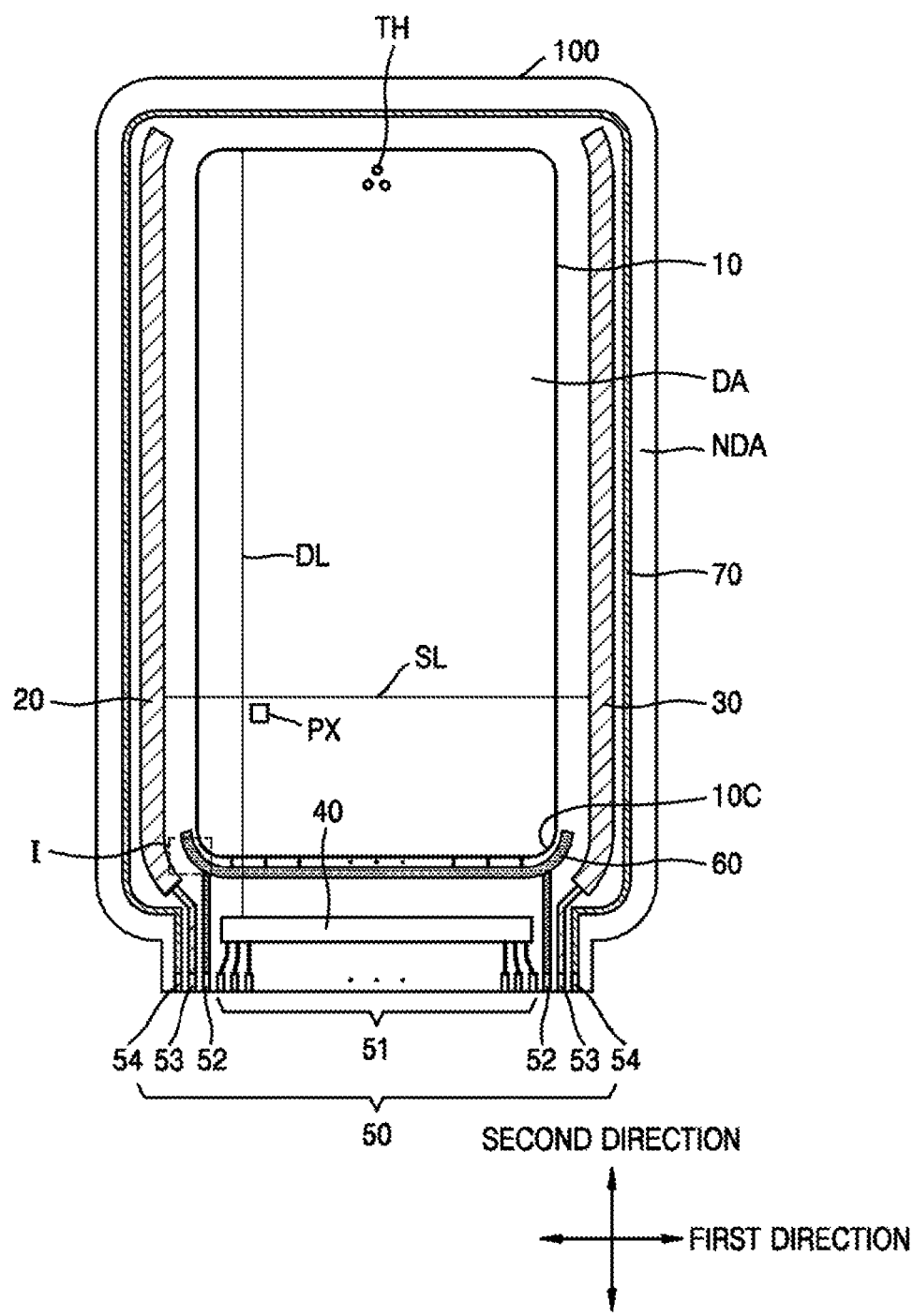

According to the exemplary embodiment described above with reference to FIG. 1, one through portion TH is partially surrounded by the display area DA. However, exemplary embodiments of the inventive concept are not limited thereto. For example, as illustrated in FIG. 15, in an exemplary embodiment, the through portion TH may be disposed entirely inside the display area DA, and in this case, the through portion TH may be entirely surrounded by the pixels PX of the display area DA. Further, as illustrated in FIGS. 16 and 17, a plurality of through portions TH may be provided in a through portion TH that is partially or entirely surrounded by the display area DA.

According to exemplary embodiments of the inventive concept, each of the scan connection lines SCL connecting the first scan driver 20 to the scan lines SL is connected to one of the scan lines SL through a contact hole CNT (e.g., a first contact hole CNT). The first contact hole CNT may be disposed in at least one insulating layer disposed between the scan lines SL and the scan connection lines SCL. The first contact hole CNT may be disposed in at least one of, for example, the dielectric layer 105, the interlayer insulating layer 107, and the planarization layer 109. Further, each of the scan connection lines SCL is connected to a signal output terminal 21a of the first scan driver 20 through a contact hole CNT (e.g., a second contact hole CNT). The second contact hole CNT may be disposed in at least one insulating layer disposed between the signal output terminal 21a and the scan connection lines SCL. The at least one insulating layer through which the second contact hole CNT is disposed may be the same insulating layer through which the first contact hole CNT is disposed or an additional insulating layer. In exemplary embodiments, the second contact hole CNT may be disposed in the at least one insulating layer through which the first contact hole CNT is disposed and/or an additional insulating layer located between the signal output terminal 21a and the scan connection lines SCL.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A display device, comprising:
   a display portion defining a display area and comprising a plurality of pixels, wherein each of the pixels is connected to a scan line from among a plurality of scan lines and a data line from among a plurality of data lines;
   a scan driver disposed in a non-display area, wherein the non-display area is disposed outside of the display area; and
   a plurality of scan connection lines connecting the scan driver to the scan lines, wherein each of the scan connection lines is connected to one of the scan lines through a first contact hole disposed in at least one insulating layer, wherein the at least one insulating layer is disposed between the scan lines and the scan connection lines in a cross-sectional view.

2. The display device of claim 1, wherein each of the plurality of pixels comprises:
   a pixel circuit comprising a thin film transistor and a storage capacitor; and
   a pixel electrode connected to the pixel circuit.

3. The display device of claim 1, wherein each of the plurality of scan connection lines is connected to a signal output terminal of the scan driver through a second contact hole disposed in at least one of the at least one insulating layer and an additional insulating layer, wherein at least one of the at least one insulating layer and the additional insulating layer is disposed between the signal output terminal and the scan connection lines in a cross-sectional view.

4. The display device of claim 1, wherein each of the plurality of scan connection lines integrally extends from the scan driver to one of the scan lines.

5. The display device of claim 1, further comprising:
   a data driver disposed in the non-display area;
   a driving voltage supply line disposed in the non-display area, wherein at least a portion of the driving voltage supply line is located between the scan driver and the display portion; and
   a plurality of data connection lines disposed in the non-display area and connecting the data driver to the data lines, wherein at least one of the data connection lines overlaps the portion of the driving voltage supply line in a region between the scan driver and the display portion.

6. The display device of claim 1, wherein the display portion has a polygonal shape, a circular shape, or an elliptical shape.

7. The display device of claim 1, wherein at least two of the pixels are adjacent to an outer edge of the display portion and are arranged in a stepwise configuration.

8. The display device of claim 1, wherein at least a portion of the scan driver is curved.

9. The display device of claim 1, further comprising:
   a flexible substrate, wherein the flexible substrate comprises the display portion.

10. The display device of claim 1, wherein each of the plurality of pixels comprises an organic light-emitting diode (OLED).

11. The display device of claim 2, wherein the plurality of scan connection lines and the pixel electrodes comprise a same material.

12. The display device of claim 5, wherein a central portion of at least one of the scan connection lines disposed between two ends of the at least one of the scan connection lines crosses the scan driver, the scan line from among the plurality of scan lines, the driving voltage supply line, and the at least one of the data connection lines.

13. The display device of claim 5, wherein at least one of the plurality of scan connection lines overlaps the driving voltage supply line and the at least one of the data connection lines between the scan driver and the display portion.

14. The display device of claim 5, wherein each of the plurality of data connection lines is connected to one of the data lines through a second contact hole disposed in at least one of the at least one insulating layer and an additional insulating layer, wherein at least one of the at least one insulating layer and the additional insulating layer is disposed between the data lines and the data connection lines in a cross-sectional view.

15. The display device of claim 5, wherein the data connection lines are alternately disposed above and below the at least one insulating layer or an additional insulating layer.

16. The display device of claim 5, wherein the data connection lines comprise a same metallic element.

17. The display device of claim 5, wherein the driving voltage supply line and the data lines comprise a same material.

18. The display device of claim 5, wherein the driving voltage supply line, the plurality of data connection lines, and the plurality of scan connection lines comprise different materials.

19. The display device of claim 5, further comprising:
a first insulating layer disposed between the driving voltage supply line and the data connection lines in a cross-sectional view,
wherein the driving voltage supply line is disposed above the first insulating layer, and the data connection lines are disposed below the first insulating layer.

20. The display device of claim 15, wherein neighboring data connection lines from among the plurality of data connection lines do not overlap each other.

21. The display device of claim 19, further comprising:
a second insulating layer disposed above the driving voltage supply line,
wherein the scan connection lines are disposed above the second insulating layer.

22. The display device of claim 19, further comprising:
a second insulating layer disposed below the driving voltage supply line,
wherein the scan connection lines are disposed below the second insulating layer.

23. The display device of claim 7, wherein the at least two of the pixels are arranged in a corner region of the display portion.

24. A display device, comprising:
a substrate;
a display portion disposed above the substrate and comprising a plurality of pixels, wherein each of the pixels is connected to a scan line from among a plurality of scan lines and a data line from among a plurality of data lines, and at least two of the pixels are adjacent to an outer edge of the display portion and arranged in a stepwise configuration;
a scan driver disposed above the substrate and configured to transmit a scan signal via a plurality of scan connection lines connected to the scan lines, wherein each of the scan connection lines is connected to one of the scan lines through a first contact hole;
a data driver disposed above the substrate;
a driving voltage supply line, wherein at least a portion of the driving voltage supply line is adjacent to the at least two of the pixels; and
a plurality of data connection lines configured to connect the data driver to the data lines, wherein at least one of the data connection lines overlaps the portion of the driving voltage supply line in a region adjacent to the at least two of the pixels.

25. The display device of claim 24, wherein each of the plurality of data connection lines is connected to one of the data lines through a second contact hole disposed in at least one insulating layer, wherein the at least one insulating layer is disposed between the data lines and the data connection lines in a cross-sectional view.

26. The display device of claim 24, wherein the data connection lines are alternately disposed above and below an insulating layer.

27. The display device of claim 24, wherein the driving voltage supply line is bent in a stepwise configuration along the at least two of the pixels.

28. The display device of claim 24, wherein the scan driver is disposed outside the display portion, and at least a portion of the driving voltage supply line is located between the scan driver and the display portion.

29. The display device of claim 24, wherein at least one scan connection line from among the plurality of scan connection lines overlaps the driving voltage supply line.

30. The display device of claim 24, wherein each of the plurality of scan connection lines integrally extends from the scan driver to one of the scan lines.

31. The display device of claim 24, wherein the plurality of scan connection lines and pixel electrodes of the plurality of pixels comprise a same material.

32. The display device of claim 24, wherein the driving voltage supply line and the data lines comprise a same material.

33. The display device of claim 24, wherein each of the plurality of pixels comprises a thin film transistor and a storage capacitor, and the data connection lines comprise a same material as one of gate electrodes of the thin film transistors and electrodes of the storage capacitors.

34. The display device of claim 24, wherein each of the plurality of pixels comprises an organic light-emitting diode (OLED).

35. The display device of claim 24, wherein the substrate is flexible.

36. The display device of claim 24, wherein the display portion has a polygonal shape, a circular shape, or an elliptical shape.

37. The display device of claim 26, wherein neighboring data connection lines from among the plurality of data connection lines do not overlap each other.

38. The display device of claim 30, wherein each of the first contact holes is located at an end of one of the scan connection lines.

39. A display device, comprising:
a display portion defining a display area and comprising a plurality of pixels, wherein each of the pixels is connected to a scan line from among a plurality of scan lines and a data line from among a plurality of data lines;
a scan driver disposed in a non-display area, wherein the non-display area is disposed outside of the display area; and a plurality of scan connection lines connecting the scan driver to the scan lines, wherein each scan connection line is connected to one signal output terminal from among a plurality of signal output terminals of the scan driver through a first contact hole disposed at a first end of the scan connection line, and is connected to one scan line from among the plurality of scan lines via a second contact hole disposed at a second end of the scan connection line.

40. The display device of claim 39, wherein each scan connection line is a continuous line having no breaks between the first contact hole and the second contact hole.

41. The display device of claim 39, wherein the first contact hole is disposed in at least one insulating layer, and the at least one insulating layer is disposed between the scan lines and the scan connection lines in a cross-sectional view.

42. The display device of claim 39, wherein the second contact hole is disposed in at least one insulating layer, and the at least one insulating layer is disposed between the signal output terminals and the scan connection lines in a cross-sectional view.

43. The display device of claim 39, wherein at least two of the pixels are arranged in a stepwise configuration in a corner region of the display portion.

* * * * *